(12) United States Patent
Chang et al.

(10) Patent No.: US 11,245,047 B2
(45) Date of Patent: Feb. 8, 2022

(54) METHOD OF MANUFACTURING SOLAR CELL

(71) Applicant: LG ELECTRONICS INC., Seoul (KR)

(72) Inventors: Won Jae Chang, Seoul (KR); Young Gu Do, Seoul (KR); Sung Jin Kim, Seoul (KR); Ju Hwa Cheong, Seoul (KR); Jun Yong Ahn, Seoul (KR); Hae Jong Cho, Seoul (KR); Ji Soo Ko, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/737,461

(22) Filed: Jan. 8, 2020

(65) Prior Publication Data

US 2020/0220039 A1 Jul. 9, 2020

(30) Foreign Application Priority Data

Jan. 9, 2019 (KR) .................. 10-2019-0002792
Jan. 21, 2019 (KR) .................. 10-2019-0007668

(51) Int. Cl.
*H01L 31/18* (2006.01)
*H01L 31/0747* (2012.01)
(Continued)

(52) U.S. Cl.
CPC ...... *H01L 31/182* (2013.01); *H01L 31/02168* (2013.01); *H01L 31/02363* (2013.01); *H01L 31/022425* (2013.01); *H01L 31/0747* (2013.01)

(58) Field of Classification Search
CPC ............. H01L 31/182; H01L 31/02168; H01L 31/022425; H01L 31/02363; H01L 31/0747
See application file for complete search history.

(56) References Cited

U.S. PATENT DOCUMENTS

2018/0254375 A1  9/2018 Adachi et al.

FOREIGN PATENT DOCUMENTS

CN    105655427 A  *  6/2016  ..... H01L 31/022433
KR   10-2010-0073645 A     7/2010
(Continued)

OTHER PUBLICATIONS

Manea et al., Optimization of front surface texturing processes for high-efficiency silicon solar cells—ScienceDirect, May 2005.*
(Continued)

*Primary Examiner* — Niki Bakhtiari
(74) *Attorney, Agent, or Firm* — Birch, Stewart, Kolasch & Birch, LLP

(57) ABSTRACT

Provided are a method of manufacturing a solar cell, including a polycrystalline silicon layer forming operation of forming a polycrystalline silicon layer containing a first dopant on a back surface of a semiconductor substrate formed of a single crystal silicon material including a base region, a front texturing operation of texturing a front surface of the semiconductor substrate and simultaneously removing the polycrystalline silicon layer formed on the front surface of the semiconductor substrate, a second conductive region forming operation of forming a second conductive region by diffusing a second dopant on the front surface of the semiconductor substrate, a passivation layer forming operation of forming a first passivation layer on the polycrystalline silicon layer formed on the back surface of the semiconductor substrate and forming a second passivation layer on the second conductive region of the front surface of the semiconductor substrate, and an electrode forming operation of forming a first electrode connected to the polycrystalline silicon layer through the first passivation layer and forming a second electrode layer at the second conductive region through the second passivation layer.

11 Claims, 32 Drawing Sheets

(51) Int. Cl.
*H01L 31/0236* (2006.01)
*H01L 31/0216* (2014.01)
*H01L 31/0224* (2006.01)

(56) References Cited

FOREIGN PATENT DOCUMENTS

| KR | 10-2013-0119569 A | 11/2013 |
| KR | 10-2017-0087179 A | 7/2017 |
| KR | 10-1886818 B1 | 8/2018 |

OTHER PUBLICATIONS

Zhang et al., A continuous, single-face wet texturing process for industrial multicrystalline silicon solar cells using a surfactant treated photoresist mask—ScienceDirect, Jun. 15, 2018.*

* cited by examiner (a)     (b)

(a)

(b)

METHOD OF MANUFACTURING SOLAR CELL

CROSS-REFERENCE TO RELATED APPLICATION

This application claims priority to and the benefit of Korean Patent Application No. 10-2019-0002792 filed in the Korean Intellectual Property Office on Jan. 9, 2019 and Korean Patent Application No. 10-2019-0007668 filed in the Korean Intellectual Property Office on Jan. 21, 2019, all of these applications are hereby expressly incorporated by reference into the present application.

BACKGROUND OF THE INVENTION

Field of the Invention

The present disclosure relates to a solar cell manufacturing method, and more particularly, to a method of manufacturing a solar cell capable of simplifying a process of manufacturing a solar cell by isolating a first conductive region and a second conductive region when a front surface of a semiconductor substrate is textured during the solar cell manufacturing process.

Related Art

A solar cell includes an n-type conductive region and a p-type conductive region and may produce electric power as a carrier suitable for each conductive type moves to the n-type conductive region and the p-type conductive region.

Therefore, when the n-type conductive region and the p-type conductive region are short-circuited, power generation efficiency of the solar cell may be significantly reduced. Therefore, it is necessary to isolate the n-type conductive region and the p-type conductive region from each other.

As a method of forming isolation, a method of removing a side surface of a semiconductor substrate for a solar cell using reactive ion etching (RIE) using a sulfur hexafluoride ($SF_6$) gas, a chlorine ($Cl_2$), or an oxygen ($O_2$) gas is known.

However, in the case of forming isolation using the RIE, the sulfur hexafluoride ($SF_6$) gas, chlorine ($Cl_2$) gas, oxygen ($O_2$) gas, and the like remain on a surface of the semiconductor substrate. The sulfur hexafluoride ($SF_6$), chlorine ($Cl_2$), oxygen ($O_2$), and the like remaining on the surface of the semiconductor substrate contaminate an outer wall of semiconductor equipment during transfer of the semiconductor substrate, resulting in an operation error of the semiconductor equipment. In order to prevent the above problems, a separate additional auxiliary device should be installed in the semiconductor device, thereby increasing a manufacturing cost of the solar cell.

In addition, in the case of forming isolation using the RIE, isolation is formed on each semiconductor substrate in a state where a plurality of semiconductor substrates are arranged in a tray, and here, isolation is not formed as much as desired on the semiconductor substrate arranged on an outer portion of the tray, among the plurality of semiconductor substrates arranged in the tray, thereby increasing a defective rate of the solar cell and increasing the cost.

SUMMARY OF THE INVENTION

The present disclosure provides a method of manufacturing a solar cell, capable of minimizing an influence on solar cell manufacturing equipment and implementing an isolation structure more stably and naturally.

A solar cell manufacturing method for forming an isolation structure of a solar cell according to a first embodiment of the present disclosure includes: a polycrystalline silicon layer forming operation of forming a polycrystalline silicon layer containing a first dopant on a back surface of a semiconductor substrate formed of a single crystal silicon material including a base region, a front surface texturing operation of removing the polycrystalline silicon layer formed on a front surface of the semiconductor substrate and texturing the front surface of the semiconductor substrate, a second conductive region forming operation of diffusing a second dopant on the front surface of the semiconductor substrate to form a second conductive region, a passivation layer forming operation of forming a first passivation layer on the polycrystalline silicon layer formed on the back surface of the semiconductor substrate and forming a second passivation layer on the second conductive region on the front surface of the semiconductor substrate, and an electrode forming operation of forming a first electrode connected to the polycrystalline silicon layer through the first passivation layer and forming a second electrode layer at the second conductive region through the second passivation layer.

The second conductive region forming operation may include a dopant layer forming operation of forming a dopant layer having a second dopant on the front surface of the semiconductor substrate, and a heat treatment operation of heat-treating the semiconductor substrate to diffuse the second dopant of the dopant layer to the front surface of the semiconductor substrate.

The front surface texturing operation may be selectively performed on the front surface of the semiconductor substrate.

The method may further include performing saw damage etching (SDE) on the semiconductor substrate, before forming the polycrystalline silicon layer.

The method may further include forming a control passivation layer on the entire surface of the semiconductor substrate, before the forming of the polycrystalline silicon layer.

The control passivation layer and the polycrystalline silicon layer formed on the front surface of the semiconductor substrate may be simultaneously removed in the front surface texturing operation.

In the polycrystalline silicon layer forming operation, the polycrystalline silicon layer may be formed on the back surface of the semiconductor substrate, on side surfaces of the semiconductor substrate, and at an edge portion of the front surface of the semiconductor substrate.

The front surface texturing operation may be performed through wet etching.

In an example, in the wet etching, in a state where the front surface of the semiconductor substrate is in contact with a roller partially immersed in a texturing etching solution, when the roller rotates, the texturing etching solution present on the surface of the roller may etch the front surface of the semiconductor substrate to form textured depressions and protrusions on the front surface of the semiconductor substrate.

Here, the texturing etching solution may include potassium hydroxide (KOH) and alkali-based deionized water (DI-water).

The dopant layer forming operation may include forming a dopant layer at edge portions of the front, side, and back surfaces of the semiconductor substrate, forming an undoped silicate glass (USG) on the dopant layer, and removing the dopant layer and the undoped silicate glass formed at the edge portions of side and back surfaces of the semiconductor substrate.

In the heat treatment operation, the first dopant may be activated to cause the polycrystalline silicon layer to be formed as a first conductive region, and the second dopant may be diffused and activated on the front surface of the semiconductor substrate to form the second conductive region on the front surface of the semiconductor substrate.

The method may further include a cleaning operation of removing the dopant layer, after the heat treatment operation.

In addition, the method may further include a mask forming operation of forming a mask layer for preventing texturing etching, on the polycrystalline silicon layer of the back surface of the semiconductor substrate, between the polycrystalline silicon layer forming operation and the front surface texturing operation.

The mask forming operation may include forming the mask layer on the entire surface of the polycrystalline silicon layer and on the entire front surface of the semiconductor substrate, and removing a portion of the mask layer other than a portion thereof formed on the polycrystalline silicon layer positioned on the back surface of the semiconductor substrate.

In a state where the mask layer is formed on a polycrystalline silicon layer positioned on a back surface of the semiconductor substrate, the front surface texturing operation may be performed on the front surface of the semiconductor substrate, and the mask layer may be removed after the front surface texturing operation is finished.

The front surface texturing operation may be performed in a state where the mask layer is formed on the back surface of the semiconductor substrate, and in a state where the front surface of the semiconductor substrate with the mask layer formed thereon is in contact with a roller partially immersed in a texturing etching solution, when the roller rotates, the texturing etching solution present on the roller may etch the front surface of the semiconductor substrate to form textured depressions and protrusions on the front surface of the semiconductor substrate or the semiconductor substrate having the mask layer may be immersed in the texturing etching solution filled in a bath to form the textured depressions and protrusions on the front surface of the semiconductor substrate.

The solar cell manufacturing method according to an embodiment of the present disclosure may implement the isolation structure in which the different conductive regions are naturally spaced through the front surface texturing operation and the dopant layer forming operation, thereby simplifying and facilitating the manufacturing process of the solar cell.

In addition, since the solar cell manufacturing method of the present disclosure does not use reactive ion etching (RIE) to form an isolation structure, it is possible to prevent contamination of the semiconductor equipment, and since an auxiliary device is not required to prevent contamination of the equipment, a manufacturing cost may be reduced.

A solar cell manufacturing method for forming an isolation structure of a solar cell according to a second embodiment of the present disclosure includes: a first conductive region forming operation of forming a first conductive region formed of a polycrystalline silicon layer doped with a first conductivity type dopant on one surface of a semiconductor substrate including a base region, a second conductive region forming operation of forming a second conductive region doped with a second conductivity type dopant opposite to the first conductive region on the other surface of the semiconductor substrate, a coating operation of applying an etching paste to a portion adjacent to an edge of the one surface or the other surface of the semiconductor substrate between the first and second conductive region forming operations or after the first and second conductive region forming operations, and an etching operation of etching the portion of the semiconductor substrate adjacent to the edge with the etching paste to form an isolation line.

The first conductive region forming operation may include a polycrystalline silicon layer deposition operation of depositing the polycrystalline silicon layer on one surface of the semiconductor substrate, the second conductive region forming operation may include a dopant layer forming operation of forming a dopant layer containing the second conductivity type dopant on the other surface of the semiconductor substrate, and each of the first and second conductive region forming operations comprises a heat treatment operation of heat-treating the semiconductor substrate before the coating operation, after the polycrystalline silicon layer deposition operation and the dopant layer forming operation.

The method may further include, before the first conductive region forming operation and the second conductive region forming operation, a texturing operation of texturing one surface of the semiconductor substrate and the other surface of the semiconductor substrate to form depressions and protrusions, and a control passivation layer deposition operation of forming a control passivation layer on one surface of the semiconductor substrate, wherein the polycrystalline silicon layer is deposited on the control passivation layer.

In this case, the coating operation and the etching operation may be performed after the heat treatment operation, after the first and second conductive region forming operations, and the etching paste is applied to be spaced apart from an edge of the first conductive region positioned on one surface of the semiconductor substrate or applied to be spaced apart from an edge of the second conductive region positioned on the other surface of the semiconductor substrate.

The etching paste may be applied at a distance of 2 mm or less from the edges of the first conductive region or the second conductive region, an aspect ratio of the etching paste may be 0.1 to 1, a thickness of the etching paste may be 2 um to 500 um, and a line width of the etching paste may be 20 um to 500 um.

The etching paste may include polymer particles and etching materials, and the polymer particles may include at least one of polystyrene, polyacrylate, polyamide, polyimide, polymethacrylate, melamine, urethane, benzo guanine, phenolic resin, silicone resin, fluorinated polymers, and micronized wax, and the etching materials may include at least one of ammonium difluoride ($NH_4HF_2$) and phosphoric acid ($H_3PO_4$).

A depth of the isolation line etched by the etching operation may be 2 um to 5 um, and a line width of the isolation line may be 20 um to 500 um.

Thus, a portion of the first conductive region or the second conductive region may be etched in the etching operation to expose the base region of the semiconductor substrate.

In addition, the method may further include a cleaning operation of removing the etching paste after the etching operation, a passivation layer deposition operation of depositing a first passivation layer on the first conductive region and depositing a second passivation layer on the second conductive region, after the cleaning operation, and an electrode forming operation of forming a first electrode connected to the first conductive region through the first passivation layer and forming a second electrode connected to the second conductive region through the second passivation layer.

Therefore, the base region of the semiconductor substrate exposed in the etching operation may be covered by the first passivation layer or the second passivation layer in the passivation layer deposition operation.

In addition, the dopant layer forming operation may be performed between the polycrystalline silicon layer deposition operation and the heat treatment operation, and the coating operation and the etching operation included in the isolation operation may be performed on one surface and the other surface of the semiconductor substrate between the dopant layer forming operation and the heat treatment operation.

The dopant layer forming operation may be performed between the polycrystalline silicon layer deposition operation and the heat treatment operation, and the coating operation and the etching operation included in the isolation operation may be performed on one surface of the semiconductor substrate between the polycrystalline silicon layer deposition operation and the dopant layer forming operation.

A solar cell according to an embodiment of the present disclosure may include a semiconductor substrate having a base region, a first conductive region positioned on one surface of the semiconductor substrate and formed of a polycrystalline silicon layer doped with a first conductivity type dopant, a second conductive region positioned on the other surface of the semiconductor substrate and doped with a second conductivity type dopant opposite to the first conductive region, a first electrode connected to the first conductive region, and a second electrode connected to the second conductive region, wherein an isolation line formed by removing a portion of the first conductive region or a portion of the second conductive region is provided in the form of a line spaced apart from the first electrode or the second electrode and parallel to an edge of the one surface or the other surface of the semiconductor substrate.

In addition, the solar cell may further include a first passivation layer on the first conductive region, and a second passivation layer on the second conductive region.

The first passivation layer may be in contact with a base region of the semiconductor substrate through the first conductive region at a portion where the isolation line is positioned when the isolation line is positioned on one surface of the semiconductor substrate, and the second passivation layer may be in contact with the base region of the semiconductor substrate through the second conductive region at the portion where the isolation line is positioned when the isolation line is positioned on the other surface of the semiconductor substrate.

The control passivation layer may be further positioned between the semiconductor substrate and the first conductive region.

An isolation line may be positioned on one surface of the semiconductor substrate, and the first passivation layer may be in contact with the base region of the semiconductor substrate through the first conductive region and the control passivation layer at a portion where the isolation line is positioned.

Here, the position of the isolation line may be closer to an end of the first electrode or the second electrode than the edge of the edge of one surface or the other surface of the semiconductor substrate.

In addition, a depth of the isolation line formed from the surface of the first conductive region or the second conductive region may be larger than a thickness of the first conductive region or the second conductive region and may be 3 um to 5 um.

A line width of the isolation line may be 20 um or greater.

A distance between the isolation line and the edge may be larger than the line width of the isolation line and may be 2 mm or less.

According to the method of forming an isolation line by etching a portion of the semiconductor substrate by applying an etching paste to the edge of one surface or the other surface of the semiconductor substrate, contamination of semiconductor equipment may be minimized, and since the etching paste is applied to each solar cell, a defective rate for the edge isolation structure may be minimized.

In addition, since the edge isolation structure is formed by performing etching by applying the etching paste, a manufacturing process may be simplified.

DESCRIPTION OF THE EMBODIMENTS

Figure 1:
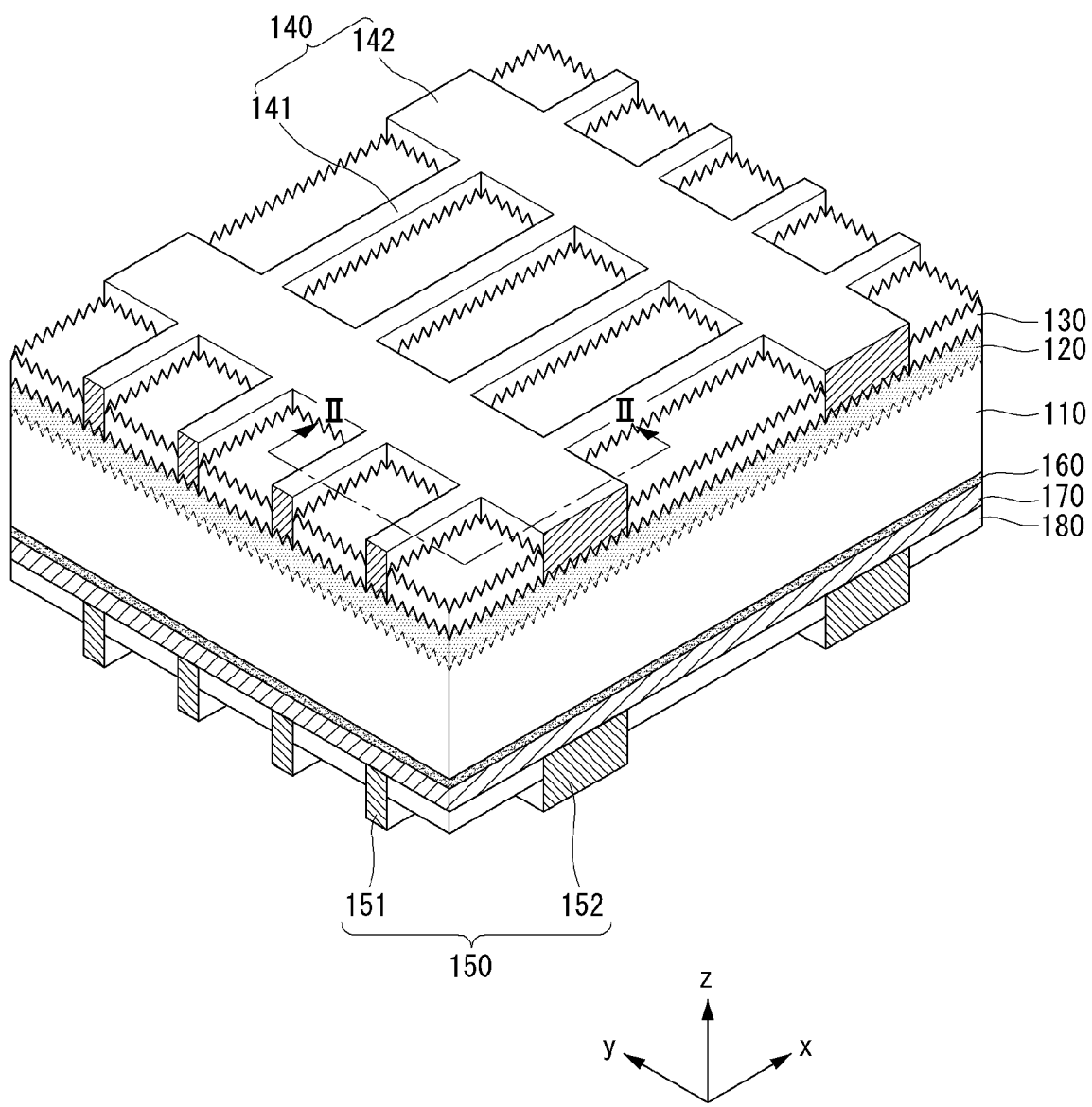
FIGS. 1 and 2 are views illustrating a solar cell according to the present disclosure.

Hereinafter, embodiments will be described in detail with reference to the accompanying drawings such that they can be easily practiced by those skilled in the art to which the present invention pertains. As those skilled in the art would realize, the described embodiments may be modified in various different ways, all without departing from the spirit or scope of the present invention. In the accompanying drawings, a portion irrelevant to description of the present invention will be omitted for clarity. Like reference numerals refer to like elements throughout.

In the drawings, the thickness of layers, films, regions, panels, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present. Also, when an element is formed "overall" on another element, it means that the element is not formed on a portion of the edge of the other element, as well as being formed on the entire surface of the other element.

Further, when a thickness or width of an element is equal to a thickness or width of another element, it means that they are the same within a range of 10% including a process error.

Figure 2:
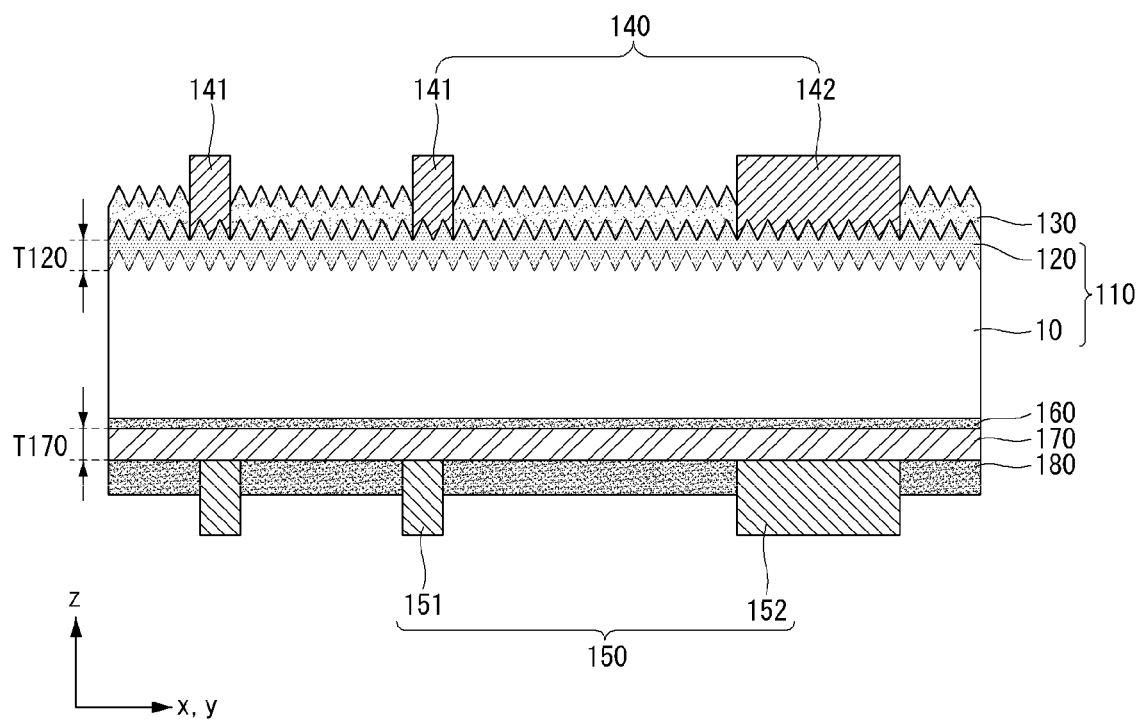

FIGS. 1 and 2 are views illustrating a solar cell according to the present disclosure. Specifically, FIG. 1 is a partial perspective view of the solar cell and FIG. 2 is a cross-sectional view of the solar cell illustrated in FIG. 1, taken along line I-I.

As illustrated in FIGS. 1 and 2, a solar cell according to an embodiment of the present disclosure may include a semiconductor substrate 110, a control passivation layer 160, a first conductive region 170, and a first passivation layer 180, a second conductive region 120, a second passivation layer 130, a first electrode 150, and a second electrode 140.

Here, the control passivation layer 160, the first passivation layer 180, and the second passivation layer 130 may be omitted, but if provided, efficiency of the solar cell may be further improved, and thus, a case where the control passivation layer 160, the first passivation layer 180, and the second passivation layer 130 are provided will be described as an example.

The semiconductor substrate 110 may be formed of a crystalline semiconductor. For example, the semiconductor substrate 110 may be formed of a single crystal or polycrystalline semiconductor (e.g., single crystal or polycrystalline silicon). In particular, the semiconductor substrate 110 may be formed of a single crystal semiconductor (e.g., a single crystal semiconductor wafer, specifically, a single crystal silicon wafer). As such, when the semiconductor substrate 110 is formed of a single crystal semiconductor (e.g., single crystal silicon), the solar cell based on the semiconductor substrate 110 formed of a crystalline semiconductor having high crystallinity and fewer defects may have excellent electrical characteristics.

In the present embodiment, the semiconductor substrate 110 may be formed of only the base region 10 without a separate doped region. As such, when a separate doped region is not formed in the semiconductor substrate 110, damage to the semiconductor substrate 110, an increase in defects, and the like, which may occur when the doped region is formed, may be prevented, thereby providing excellent passivation characteristics of the semiconductor substrate 110. As a result, surface recombination occurring on the surface of the semiconductor substrate 110 may be minimized. However, the present disclosure is not limited thereto and the semiconductor substrate 110 may further include a doped region besides the base region 10.

Hereinafter, an example in which the base region 10 and the second conductive region 120 are provided together in the semiconductor substrate 110 will be described.

In the present embodiment, a first or second conductivity type dopant is doped with a low doping concentration on the semiconductor substrate 110 or the base region 10. Therefore, the semiconductor substrate 110 or the base region 10 may have a first or second conductivity type. Here, the semiconductor substrate 110 or the base region 10 may have a lower doping concentration, higher resistance, or lower carrier concentration than one of the first and second conductive regions 170 and 120 having the same conductivity type.

A p-type dopant used as the first or second conductivity type dopant may include Group III elements such as boron (B), aluminum (Al), gallium (Ga), and indium (In). An n-type dopant may include Group V elements such as phosphorus (P), arsenic (As), bismuth (Bi), and antimony (Sb). However, the present disclosure is not limited thereto, and various dopants may be used as the first or second conductivity type dopants.

Hereinafter, a case where the first conductivity type dopant is doped in the semiconductor substrate 110 and the first conductivity type dopant is an n-type dopant will be described as an example. However, the present disclosure is not limited thereto.

A back surface and/or front surface of the semiconductor substrate 110 may be textured, and thus have depressions and protrusions.

The textured depressions and protrusions may include, for example, a (111) plane of the semiconductor substrate 110 and may have a pyramid shape having an irregular size. If surface roughness increases due to the depressions and protrusions formed on the front surface or the like of the semiconductor substrate 110 by texturing, reflectivity of light incident through the front surface or the like of the semiconductor substrate 110 may be lowered. Therefore, the amount of light reaching a p-n junction may be increased, thereby minimizing light loss.

However, the present disclosure is not limited thereto, and textured depressions and protrusions may be formed on both the back and front surfaces of the semiconductor substrate 110, and textured depressions and protrusions may not be formed on the back and front surfaces of the semiconductor substrate 110.

The control passivation layer 160 may be generally positioned on the back surface of the semiconductor substrate 110 and may be formed of a dielectric material or a silicon material and basically perform a passivation function on the back surface of the semiconductor substrate 110. In addition, the control passivation layer 160 may allow a carrier generated in the semiconductor substrate 110 to pass therethrough but is not essential.

The control passivation layer 160 may be formed of a dielectric material such as SiCx or SiOx, which is durable even in a high temperature process at 600° C. or higher or may be formed of, a-Si, silicon nitride (SiNx), hydrogenated SiNx, aluminum oxide (AlOx), silicon oxynitride (SiON), or hydrogenated SiON.

As such, the thickness of the control passivation layer 160 may be formed to be 0.5 nm to 2.5 nm.

The first conductive region 170 may be in direct contact with a back surface of the control passivation layer 160 and may be positioned on the entire region of the back surface of the control passivation layer 160. For example, the first conductive region 170 may be formed by doping a first conductivity type dopant on a polycrystalline silicon layer at a higher concentration than that of the semiconductor substrate 110. For example, an n-type dopant may be used as the first conductivity type dopant.

Therefore, when the semiconductor substrate 110 contains the first conductivity type dopant and the first conductivity type dopant is doped at a higher concentration than the semiconductor substrate 110 in the first conductive region 170, the first conductive region 170 may operate as a back surface field (BSF). However, the present disclosure is not limited thereto, and when the semiconductor substrate 110 contains the second conductivity type dopant and the first conductivity type dopant is doped in the first conductive region 170, the first conductive region 170 operate as an emitter. Hereinafter, a case where the semiconductor substrate 110 contains a first conductivity type dopant and the first conductive region 170 operates as a BSF will be described as an example.

The polycrystalline silicon layer forming the first conductive region 170 may be formed by depositing polycrystalline silicon on the back surface of the semiconductor substrate 110 or may be formed by depositing amorphous silicon on the back surface of the semiconductor substrate 110 and heat-treating the amorphous silicon to change the amorphous silicon into polycrystalline silicon.

Accordingly, the first conductive region 170 formed of polycrystalline silicon may have a crystal structure different from that of the semiconductor substrate 110 formed of single crystal silicon.

When the first conductive region 170 has a crystal structure different from that of the semiconductor substrate 110, an output voltage Voc of the solar cell may be further improved and ohmic contact with the first conductive region 170 connected to the first conductive region 170 may be further improved.

As described above, when the control passivation layer 160 formed of polycrystalline silicon is formed on the back surface of the semiconductor substrate 110 in a state where the control passivation layer 160 is formed on the back surface of the semiconductor substrate 110, thermal damage of the semiconductor substrate 110 may be minimized in terms of manufacturing process and a highly efficient solar cell may be implemented.

A thickness T170 of the first conductive region 170 may be, for example, 200 nm to 400 nm. The thickness T170 of the first conductive region 170 is based on the center of the semiconductor substrate and may be smaller or greater than 200 nm to 400 nm at the edge of the semiconductor substrate.

The first passivation layer 180 may be positioned on the first conductive region 170, that is, on the back surface of the first conductive region 170, may be formed of a dielectric material, and may have a thickness greater than the control passivation layer 160.

The first passivation layer 180 may include at least one of SiNx, SiOx, SiOxNy, SiCx, or AlOx containing a large amount of hydrogen, and perform a passivation function on the back surface of the first conductive region 170.

The second conductive region 120 may be positioned on the front surface of the semiconductor substrate 110 and may be formed by doping a second conductivity type dopant inside the front surface of the semiconductor substrate 110.

The second conductive region 120 may be formed by diffusing the second conductivity type dopant into the front surface of the semiconductor substrate 110. Accordingly, the second conductive region 120 may be formed of the same crystalline silicon material as that of the semiconductor substrate 110.

For example, when the semiconductor substrate 110 is formed of single crystal silicon, the second conductive region 120 may also be formed of single crystal silicon.

Alternatively, when the semiconductor substrate 110 is formed of polycrystalline silicon, the second conductive region 120 may also be formed of polycrystalline silicon.

A thickness T120 of the second conductive region 120 may be approximately 1.5 um to 2.5 um. However, since a smaller thickness T 120 of the second conductive region 120 is desirable, the thickness T 120 of the second conductive region 120 may be reduced to 0.1 nm to 0.3 nm.

When the semiconductor substrate 110 contains the first conductivity type dopant and the second conductive region 120 is doped with the second conductivity type dopant, the second conductive region 120 may operate as an emitter portion. However, the present disclosure is not limited thereto, and when the semiconductor substrate 110 contains the second conductivity type dopant and the second conductive region 120 is doped at a higher concentration than the semiconductor substrate 110, the second conductive region 120 may operate as a front electric field. Hereinafter, a case where the semiconductor substrate 110 contains the first conductivity type dopant and the second conductive region 120 operates as an emitter portion will be described.

The second passivation layer 130 may be directly positioned on the front surface of the second conductive region 120 to perform a passivation function on the entire surface of the second conductive region 120. The second passivation layer 130 may be formed of a dielectric material containing hydrogen. For example, the second passivation layer 130 may be formed of at least one of SiNx, SiOx, SiOxNy, or AlOx.

The second passivation layer 130 may improve transmittance of light incident on the solar cell and reduce the reflectivity, so that a maximum amount of light may be incident on the semiconductor substrate 110.

The first electrode 150 may be positioned on the back surface of the semiconductor substrate 110 and may be connected to the first conductive region 170 through the first passivation layer 180.

The first electrode 150 may include a plurality of first finger electrodes 151 and a plurality of first bus bars 152 connected to the plurality of first finger electrodes 151.

The plurality of first finger electrodes 151 may be electrically and physically connected to the first conductive region 170 and may be spaced apart from each other in the second direction y and extend abreast in a first direction x. The plurality of first finger electrodes 151 may collect carriers moved toward the first conductive region 170.

The plurality of first bus bars 152 may be electrically and physically connected to the first conductive region 170 and may be spaced apart from each other in the first direction x and extend abreast in a second direction y.

Here, the plurality of first bus bars 152 may be positioned on the same layer as the plurality of first finger electrodes 151 and may be electrically and physically connected to the first finger electrodes 151 at points where the plurality of first bus bars 152 intersect the plurality of first finger electrodes 151, respectively.

In some cases, when the plurality of first bus bars 152 only serve to transfer charges collected from the first finger electrodes 151 to the outside, the plurality of first bus bars 152 may not be in contact with the first conductive region 170 and may be configured to be connected only to the first finger electrode 151. In this case, it is also possible to use an electrode material different from the first finger electrode 151.

Thus, as illustrated in FIG. 1, the plurality of first finger electrodes 151 have a stripe shape extending in the first direction x and the plurality of first bus bars 152 may have a stripe shape extending in the second direction y, so that the first electrode 150 may be positioned in a lattice shape on the front surface of the semiconductor substrate 110.

The plurality of first bus bars 152 may collect not only carriers moving from the second conductive region 120 but also carriers collected and moved by the plurality of first finger electrodes 151.

Since the plurality of first bus bars 152 should collect charges collected by the plurality of first finger electrodes 151 and move them in a desired direction, a width of each of the first bus bars 152 may be formed to be larger than a width of the first finger electrode 151. However, the present disclosure is not limited thereto, and the first bus bar and the first finger electrode may have the same line width. In this case, the width of the first bus bar 152 may be as small as the width of the first finger electrode 151.

The plurality of first bus bars 152 may be connected to an external device and output the collected carriers (e.g., electrons) to the external device.

The plurality of first finger electrodes 151 and the plurality of first bus bars 152 of the first electrode 150 may be formed of at least one conductive material such as silver (Ag).

The second electrode 140 may be positioned on the front surface of the semiconductor substrate 110 and may be connected to the second conductive region 120 through the second passivation layer 130.

Like the first electrode 150, the second electrode 140 may include a plurality of second finger electrodes 141 and a plurality of second bus bars 142 connected to the plurality of second finger electrodes 141 as illustrated in FIGS. 1 and 2. The second electrode 140 may be formed in the same pattern as the first electrode 150. However, the pattern of the second electrode 140 may be formed to be different from the pattern of the first electrode 150.

For example, the second electrode 140 may have the second finger electrode 141 and the second bus bar 142 having a lattice structure, while the first electrode 150 may include an electrode layer positioned on the entire back surface of the semiconductor substrate 110 except for a portion where the first bus bars 152 are formed.

The second electrode 140 may collect carriers moved toward the second conductive region 120.

Meanwhile, in the solar cell, the first conductive region and the second conductive region may be isolated from each other on the side of the semiconductor substrate.

As described above, the structure in which the first conductive region and the second conductive region are isolated may be naturally formed on the side surface of the solar cell when the front surface of the semiconductor substrate is textured during the solar cell manufacturing process.

Hereinafter, the isolation structure formed on the side surface of the solar cell will be described in detail.

Figure 3:
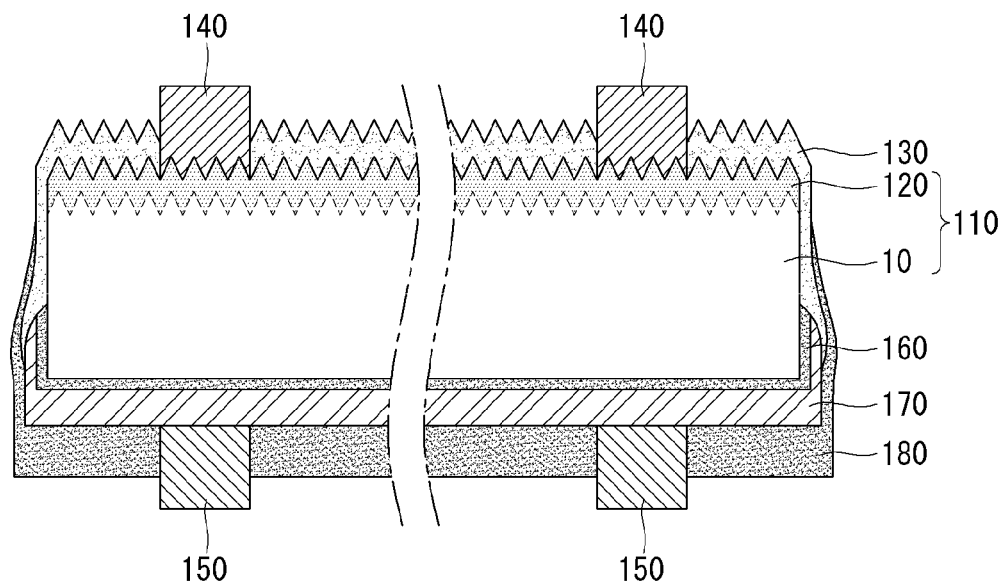
FIG. 3 is a view illustrating an isolation structure of a solar cell according to a first embodiment of the present disclosure.

FIG. 3 is a view illustrating an isolation structure of a solar cell according to a first embodiment of the present disclosure.

FIG. 3 illustrates a side surface of a solar cell in order to explain an isolation structure formed on the side surface of the solar cell illustrated in FIGS. 1 and 2.

As illustrated in FIG. 3, in the solar cell according to the present disclosure, the first conductive region and the second conductive region may be spaced apart from each other on the side surface of the semiconductor substrate to form an isolation structure.

More specifically, the first conductive region may be formed on the side surface of the semiconductor substrate and mainly formed on the back surface of the semiconductor substrate with respect to the center of the side surface of the semiconductor substrate (i.e., the center of the semiconductor substrate in the thickness direction) and the second conductive region may be mainly formed on the front surface of the semiconductor substrate with respect to the center of the side surface of the semiconductor substrate.

However, the present disclosure is not limited thereto, and the first and second conductive regions may be rarely formed on the side surface of the semiconductor substrate.

In addition, the first conductive region and the second conductive region may be spaced apart from each other in the thickness direction of the semiconductor substrate from the side surface of the semiconductor substrate, and the base region of the semiconductor substrate may be exposed at the portion where the first conductive region and the second conductive region are spaced apart from each other.

As described above, a first passivation layer or a second passivation layer may be further formed in the base region exposed to the side surface of the semiconductor substrate. For example, as illustrated in FIG. 3, the second passivation layer may be further formed at the base region exposed to the side surface of the semiconductor substrate, and the first passivation layer may be further formed on the second passivation layer further formed at the base region exposed to the side surface of the semiconductor substrate.

However, the present disclosure is not limited thereto, and the first passivation layer and the second passivation layer may be sequentially stacked at the base region exposed on the side surface of the semiconductor substrate.

Hereinafter, the solar cell manufacturing method for forming the isolation structure of the solar cell will be described in more detail.

FIGS. 4 to 14 are views illustrating an example of a solar cell manufacturing method for forming an isolation structure of a solar cell according to a first embodiment of the present disclosure.

Figure 4:
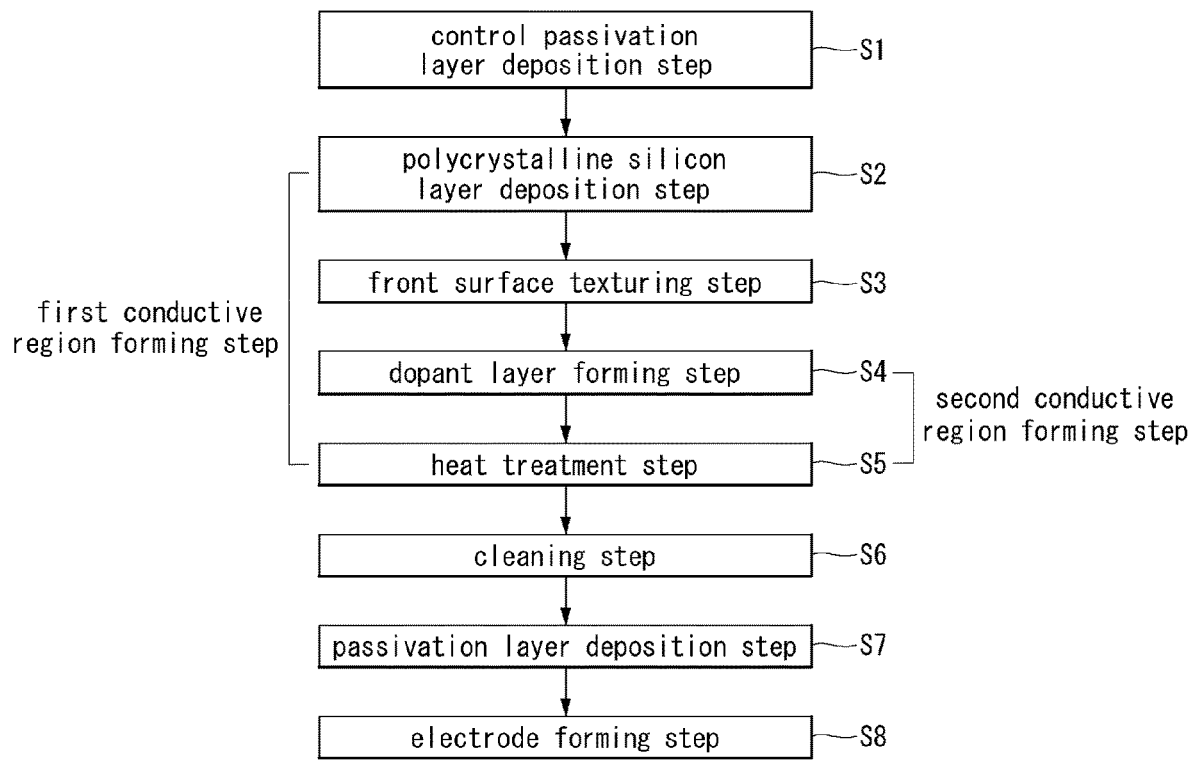
FIGS. 4 to 14 are views illustrating a first embodiment of a solar cell manufacturing method for forming an isolation structure of a solar cell according to the first embodiment of the present disclosure.

Specifically, FIG. 4 is a flowchart illustrating a method of manufacturing a solar cell, and FIGS. 5 to 14 are views illustrating each step illustrated in FIG. 4.

The solar cell manufacturing method according to the present embodiment may include a control passivation layer deposition step S1, a first conductive region 170 forming step S2, S5, a front surface texturing step S3, a second conductive region 120 forming step S4, S5, a cleaning step S6, a passivation layer deposition step S7, and an electrode forming step S8.

The first conductive region 170 forming step S2, S5 may include a polycrystalline silicon layer deposition step S2 and a heat treatment step S5, and the second conductive region 120 forming step S4, S5 may include a dopant layer forming step S4 and a heat treatment step S5.

Here, the heat treatment step S5 of the first conductive region 170 forming step and the heat treatment step S5 of the second conductive region 120 forming step may be performed at the same time during one process as described in the flowchart of FIG. 4. As a result, the manufacturing process may be further simplified.

Here, the control passivation layer deposition step S1 and the cleaning step S6 may be omitted in some cases.

In addition, although not described in the flowchart of FIG. 4, the method may further include texturing or saw damage etching (SDE) the entire surface of the semiconductor substrate 110 before the control passivation layer deposition step S1.

Figure 5:
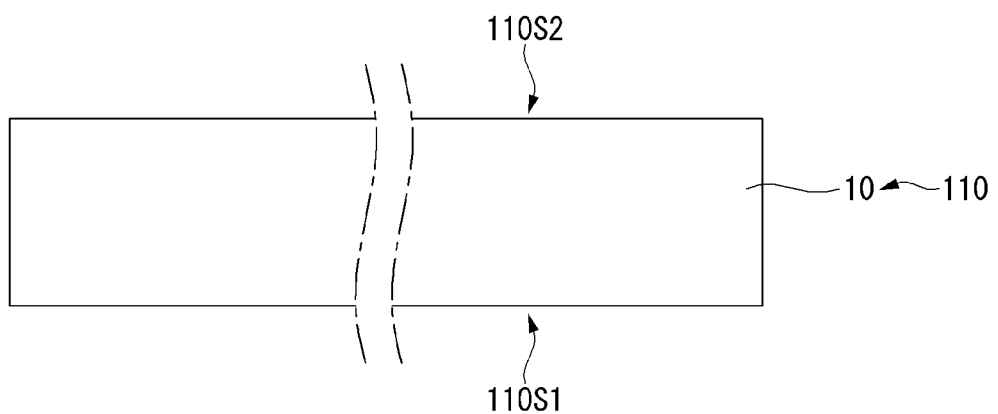
Figure 6:
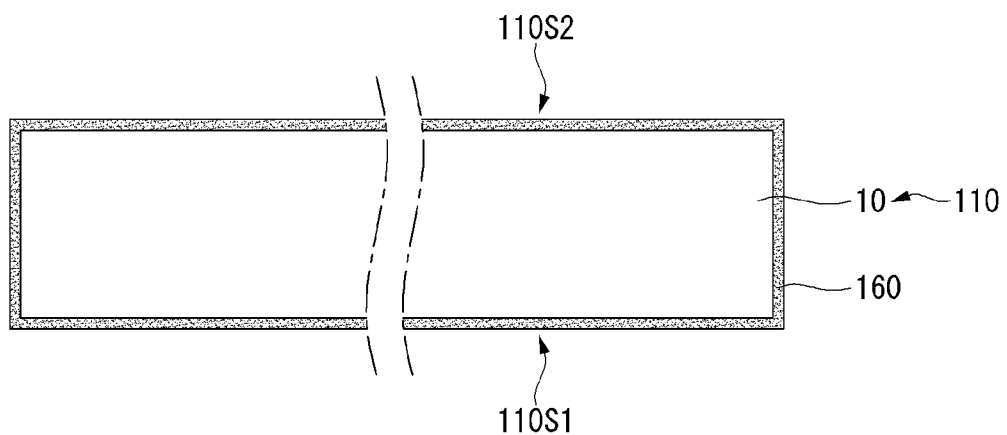

For example, when the semiconductor substrate 110 is saw damage etched before the control passivation layer deposition step S1, the entire surface of the semiconductor substrate 110 may be formed to be substantially flat as illustrated in FIG. 5. However, the present disclosure is not limited thereto, and the entire surface of the semiconductor substrate 110 may be textured after the SDE before the control passivation layer deposition step S1.

For convenience of explanation, a case where the control passivation layer deposition step S1 is performed after the SDE is performed will be described as an example.

In the control passivation layer deposition step S1, the control passivation layer 160 may be formed on the entire surface of the semiconductor substrate 110. Here, a material and a thickness of the control passivation layer 160 may be the same as those described above with reference to FIGS. 1 to 3. For example, in the control passivation layer deposition step S1, the control passivation layer 160 is formed by depositing silicon oxide (SiOx) on the front, back, and side surfaces of the semiconductor substrate 110 using a thermal oxidation process.

Figure 7:
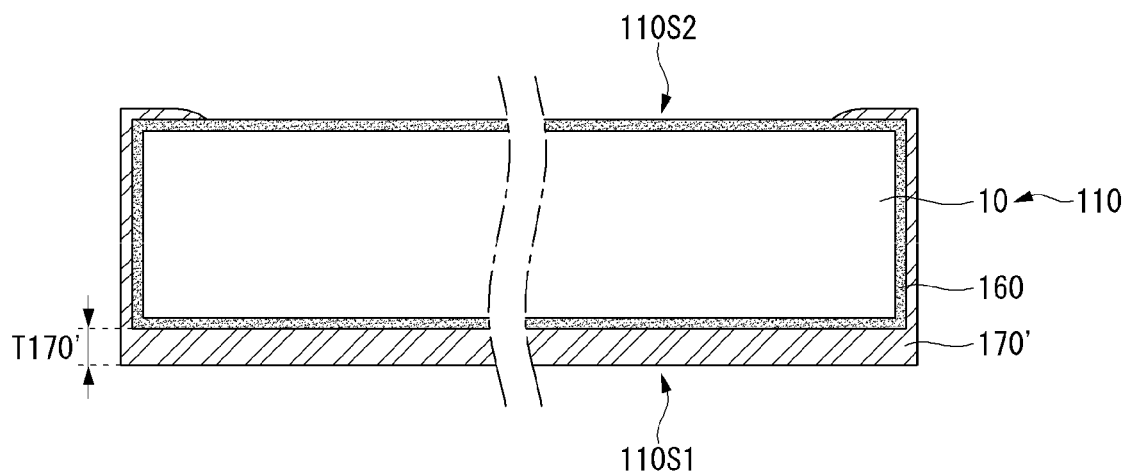

In the polycrystalline silicon layer deposition step S2, as illustrated in FIG. 7, a polycrystalline silicon layer 170' may be deposited on a back surface 110S1 of the semiconductor substrate 110, that is, on the control passivation layer, using CVD equipment to form the first conductive region 170. Here, a thickness of the deposited polycrystalline silicon layer 170' may be within 1 um. For example, the polycrystalline silicon layer 170' may be deposited to have a thickness between 300 nm and 400 nm.

The polycrystalline silicon layer 170' may be deposited on the side surface of the semiconductor substrate 110 to have a thickness smaller than the thickness thereof formed on the back surface 110S1 of the semiconductor substrate 110 and may be deposited up to an edge portion of the front surface 110S2 of the semiconductor substrate 110. The first conductivity type dopant may be doped at the polycrystalline silicon layer 170'.

In the polycrystalline silicon layer deposition step S2 of the present disclosure, a case where the polycrystalline silicon layer 170' is deposited on the back surface 110S1 of the semiconductor substrate 110 from the beginning has been described as an example but is not limited thereto. Alternatively, an amorphous silicon layer may be deposited on the back surface 110S1 of the semiconductor substrate 110 and may be heat-treated in the heat treatment step S5 to form a polycrystalline silicon layer.

In the front surface texturing step S3, the front surface of the semiconductor substrate 110 may be selectively textured.

That is, in the front surface texturing step S3, the front surface among the front surface and the back surface of the semiconductor substrate 110 may be selectively textured, and the side surface of the semiconductor substrate 110 may be partially or entirely textured.

For example, the front surface texturing step S3 may be performed by etching equipment installed in-line in a solar cell manufacturing process line. Here, a roller R1, which is a part of the etching equipment, may move the semiconductor substrate 110 in a direction of the arrow along a direction of the in-line process in a state where the part of the roller R1 is immersed in a texturing etching solution EC1.

Figure 8:
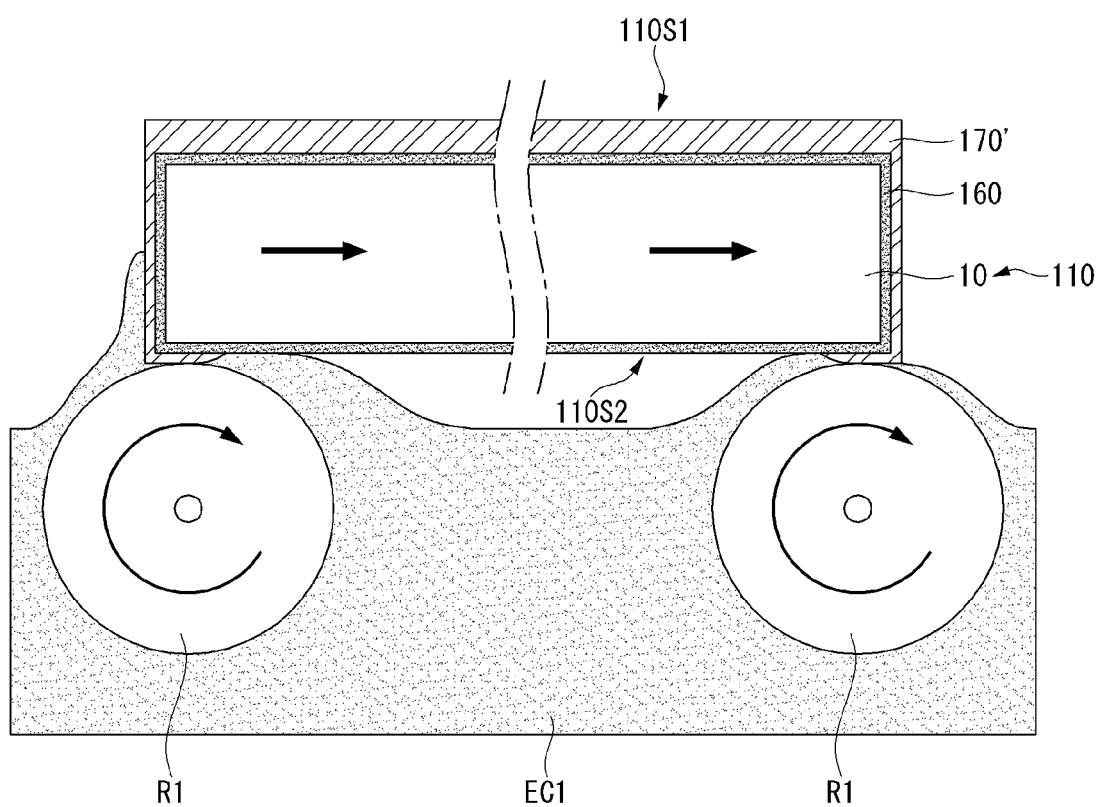

More specifically, in the front surface texturing step S3, as illustrated in FIG. 8, in a state where the front surface of the semiconductor substrate is in contact with the roller R1 partially immersed in the texturing etching solution EC1, when the roller R1 rotates, the texturing etching solution EC1 present on the surface of the roller R1 etches the front surface of the semiconductor substrate 110 to form textured depressions and protrusions on the front surface of the semiconductor substrate 110.

Figure 9:
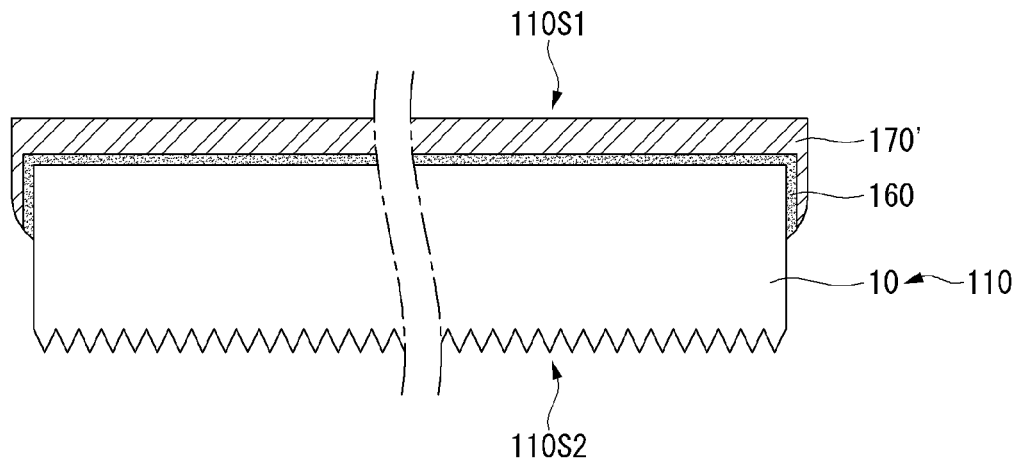

In this case, as illustrated in FIG. 9, the polycrystalline silicon layer 170' and the control passivation layer 160 formed on the side surface of the semiconductor substrate 110 may be etched by the texturing etching solution EC1 present on the surface of the roller and the textured depressions and protrusions may be formed on the front surface of the semiconductor substrate 110.

That is, when textured depressions and protrusions are formed on the front surface of the semiconductor substrate 110, the control passivation layer 160 and the polycrystalline silicon layer 170' formed at a portion of the side surface of the semiconductor substrate 110 and the edge portion of the front surface of the semiconductor substrate 110, which come into contact with the texturing etching solution EC1 present on the roller, in the side surface of the semiconductor substrate 110 where the polycrystalline silicon layer 170' is formed and the edge portion of the front surface may be etched.

As described above, the polycrystalline silicon layer 170' formed at a portion of the side surface and the edge portion of the front surface of the semiconductor substrate 110 may be etched to form an isolation portion electrically separating the first conductive region 170 and the first conductive region 170 on the side surface of the semiconductor substrate 110.

An etched depth of the front surface of the semiconductor substrate 110 etched by the texturing etching solution EC1 in the front surface texturing step S3 may fall between 5 um and 20 um.

Here, potassium hydroxide (KOH) and alkali-based deionized water (DI-water) may be used as the texturing etching solution EC1.

As illustrated in FIG. 9, the dopant layer forming step S4 may be performed to form a dopant layer 190 containing the second conductivity type dopant on the front surface 110S2 of the semiconductor substrate 110 by atmospheric pressure chemical vapor deposition (APCVD) or plasma chemical vapor deposition (PECVD) to form the second conductive region 120.

The dopant layer 190 may be, for example, a borosilicate glass (BSG) film. However, the present disclosure is not limited thereto, and the dopant layer 190 may include only a conductivity type dopant opposite to the first conductive region 170. For example, a phosphor silicate glass (PSG) layer or a layer containing another conductivity type dopant may be used as the dopant layer 190.

In order to form the dopant layer 190 on the front surface of the semiconductor substrate 110 as illustrated in FIG. 9 by performing the dopant layer forming step S4, the dopant layer 190 may be formed on the edge portions of the back, side, and front surfaces of the semiconductor substrate 110 in the dopant layer forming step S4, and thereafter, the dopant layer 190 formed at the edge portions of the back and side surfaces of the semiconductor substrate 110 may be removed.

In addition, in order to prevent impurities and hydrogen from being diffused out of the dopant layer 190 in the follow-up heat treatment step S5, an undoped silicate glass (USG) may be further formed on the dopant layer in the dopant layer forming step S4, and the USG may be removed together with the dopant layer 190 after the heat treatment step S5.

Here, the dopant layer 190 formed on the edge portions of the back and side surfaces of the semiconductor substrate 110 may be etched by dilute hydrofluoric acid (DHF) so as to be removed. In addition, the semiconductor substrate 110 or the polycrystalline silicon layer 170' may not be etched when the dopant layer 190 formed at the edge portions of the back surface and side surfaces of the semiconductor substrate 110 is removed using the hydrofluoric acid diluent (DHF).

Figure 10:
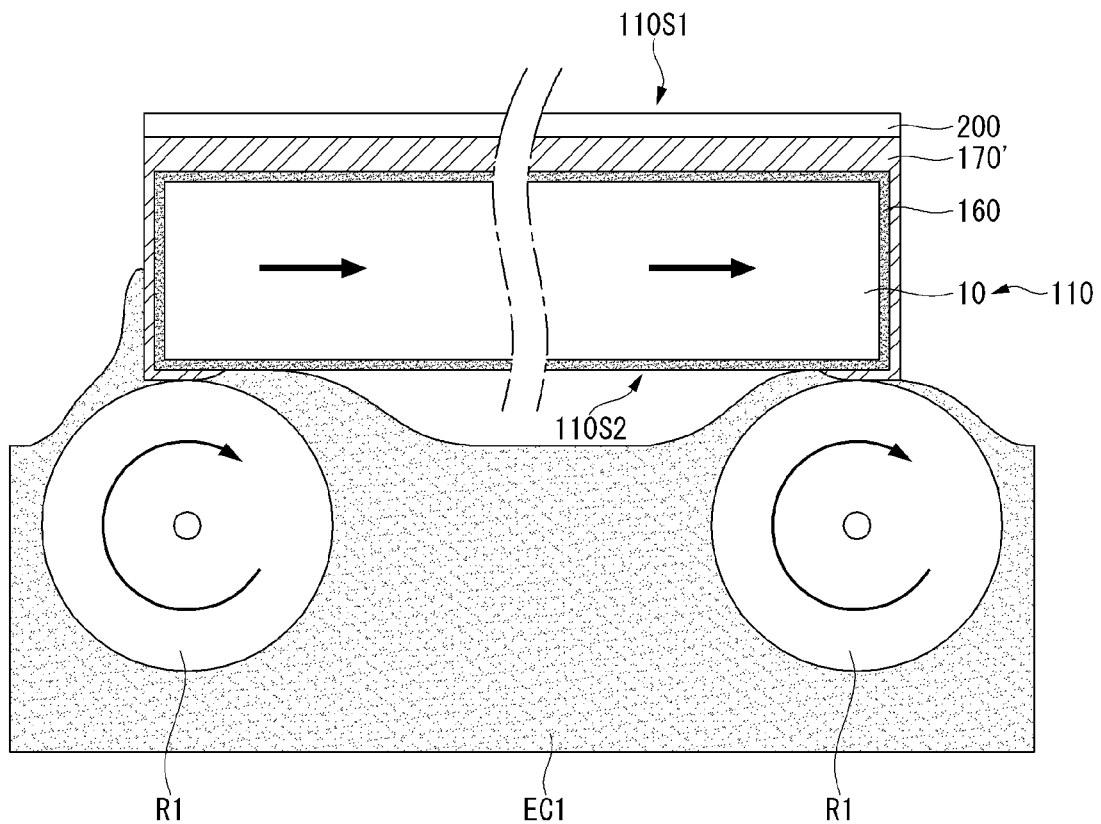

Accordingly, as illustrated in FIG. 10, the polycrystalline silicon layer 170' for forming the first conductive region 170 and the dopant layer 190 for forming the second conductive region 120 may be spaced apart from each other on the side surface of the semiconductor substrate 110 so as to be isolated.

Figure 11:
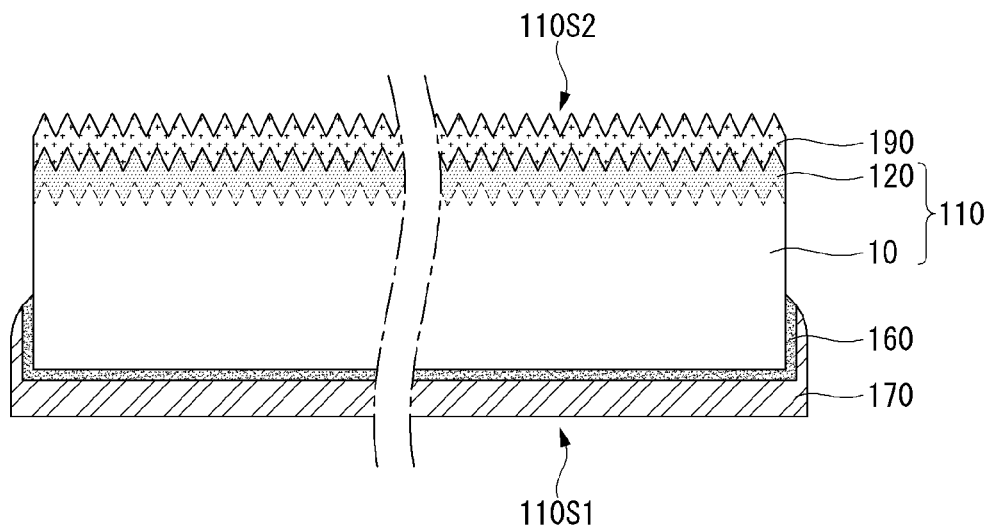

Thereafter, in the heat treatment step S5, the semiconductor substrate 110 may be, for example, heat-treated at a temperature of 800° C. to 1000° C., and as illustrated in FIG. 11, the second dopant of the dopant layer 190 may be diffused to the front surface of the semiconductor substrate 110 to form the second conductive region 120, which is a diffused region, may be formed on a portion of the base region 10 of the semiconductor substrate 110.

In addition, as illustrated in FIG. 11, the first conductivity type dopant contained in the polycrystalline silicon layer 170' may be activated by the heat treatment step S5, so that the polycrystalline silicon layer 170' may be formed as the first conductive region 170.

Here, a thickness of the first conductive region 170 may be formed to fall between 300 nm and 400 nm, and a thickness of the second conductive region 120 may be formed to fall between 1.5 um and 2.5 um.

Figure 12:
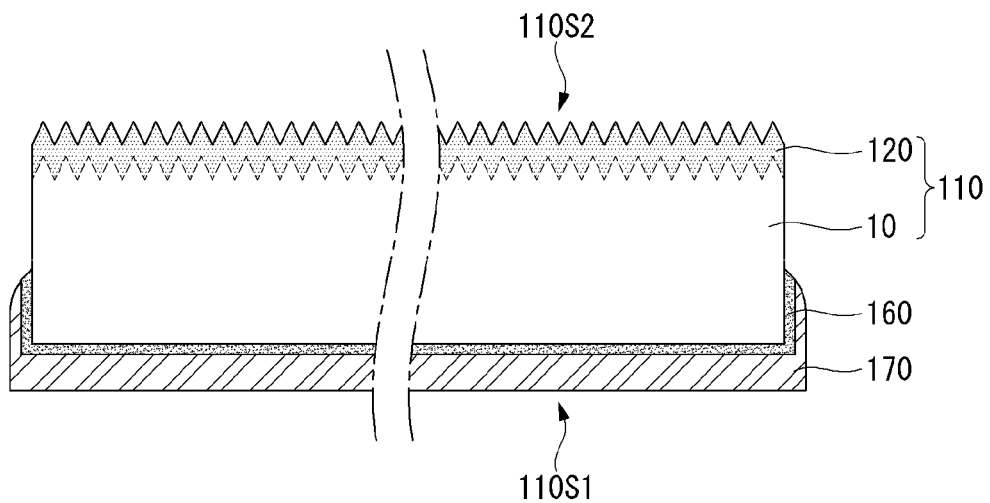

After the heat treatment step S5, in a cleaning step S6, as illustrated in FIG. 12, a residual dopant layer 190, which was provided on the front surface 110S2 of the semiconductor substrate 110 may be etched away by a hydrofluoric acid dilution (DHF), and here, the semiconductor substrate 110 or the first and second conductive regions 170 and 120 may not be etched.

Figure 13:
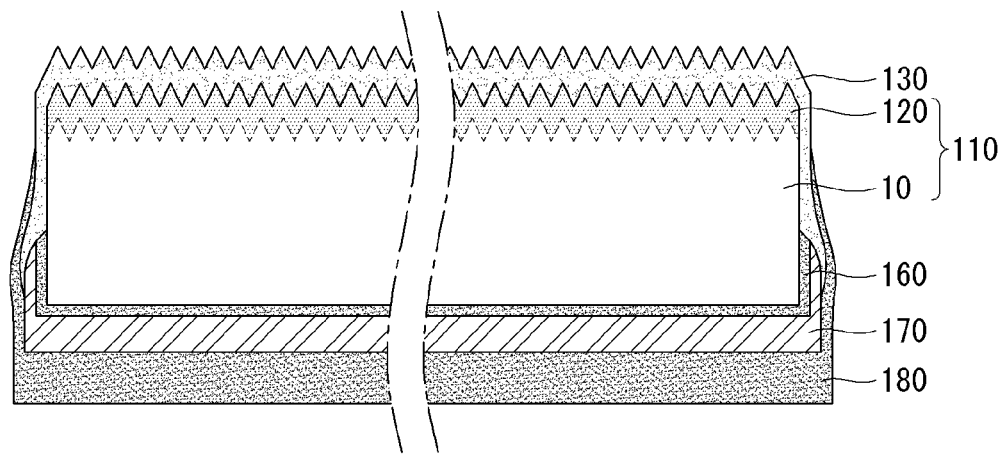

In the passivation layer deposition step S7, as illustrated in FIG. 13, the second passivation layer 130 may be deposited on the second conductive region 120, and the first passivation layer 180 may be deposited on the first conductive region 170.

In FIG. 13, the case where the second passivation layer 130 is deposited first and the first passivation layer 180 is then deposited is illustrated as an example, but deposition order of the first and second passivation layers 180 and 130 is not limited thereto. That is, the first passivation layer 180 may be deposited first, and the second passivation layer 130 may then be deposited.

Accordingly, the base region 10 exposed as the first conductive region 170 and the second conductive region 120 are spaced apart from each other on the side surface of the semiconductor substrate 110 may be covered by the first passivation layer 180 or the second passivation layer 130.

Figure 14:
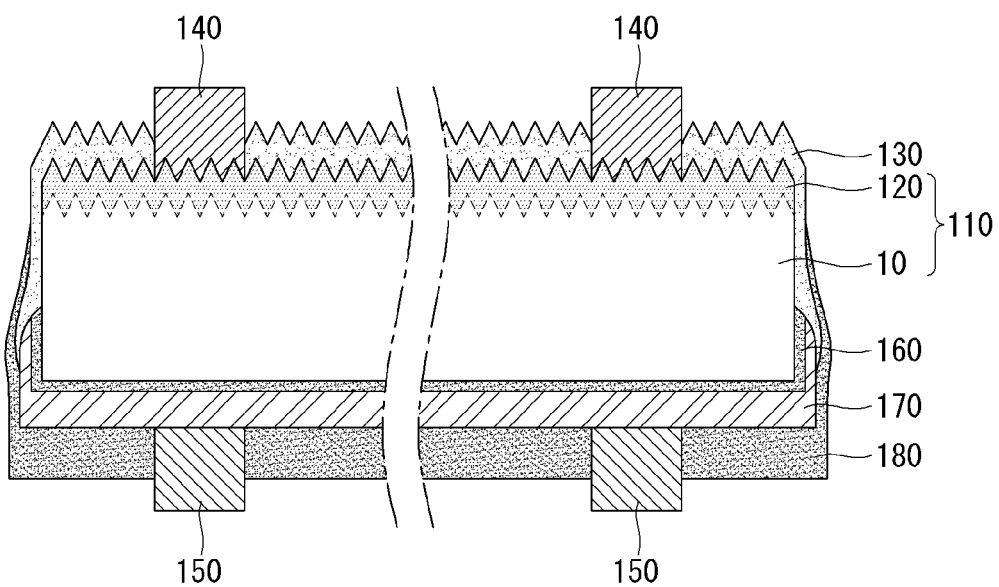

Subsequently, in the electrode forming step S8, as illustrated in FIG. 14, the first electrode 150 connected to the first conductive region 170 through the first passivation layer 180 and the second electrode 140 connected to the second conductive region 120 through the second passivation layer 130 may be formed. Accordingly, the solar cell described above with reference to FIGS. 1 to 3 may be manufactured.

Accordingly, in the solar cell manufacturing method according to the present disclosure, the isolation structure may be naturally formed, while texturing the front surface of the semiconductor substrate 110 through the front surface texturing step S3, without a separate isolation step.

In addition, since the solar cell manufacturing method of the present disclosure does not use reactive ion etching (RIE) to form the isolation structure, contamination of semiconductor equipment may be prevented, and since an auxiliary device for preventing contamination of the equipment is not required, a manufacturing cost may be further reduced.

In addition, since the solar cell manufacturing method of the present disclosure does not use reactive ion etching (RIE), a uniformity problem for the isolation structure may also be resolved.

In addition, since the isolation structure is naturally formed through the front surface texturing step S3, the dopant layer forming step S5, and the cleaning step S6, the manufacturing process of the solar cell may be simplified.

However, the solar cell manufacturing method of the present disclosure is not limited to the embodiment described above but may be modified or added in some steps. Hereinafter, another embodiment of the solar cell manufacturing method in which some components are different from the above embodiment will be described.

FIGS. 15 to 21 are views illustrating another example of a solar cell manufacturing method for forming an isolation structure of a solar cell according to a first embodiment of the present disclosure.

Figure 15:
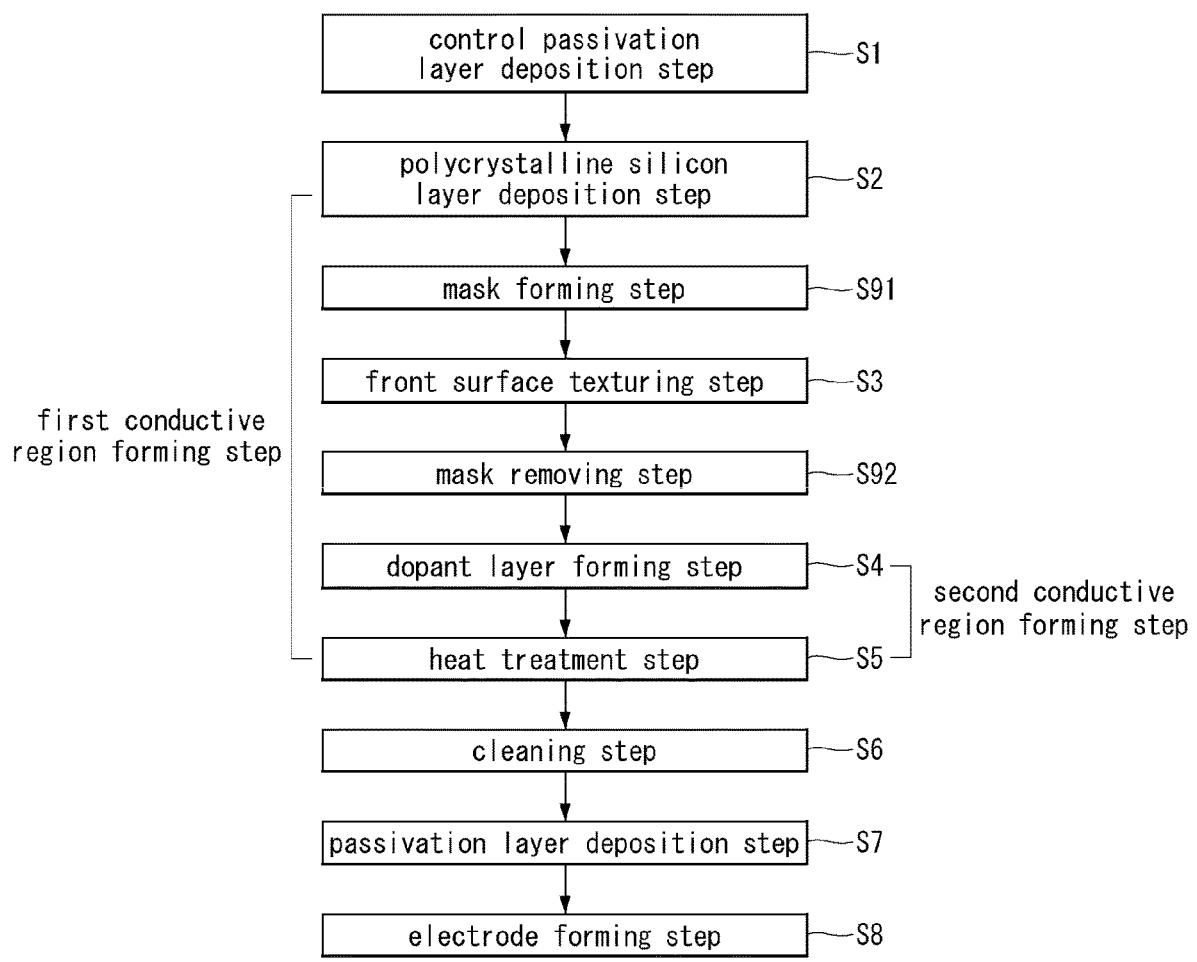
FIGS. 15 to 21 are views illustrating a second embodiment of a solar cell manufacturing method for forming an isolation structure of a solar cell according to the first embodiment of the present disclosure.

FIG. 15 is a flowchart and FIGS. 16 to 21 are diagrams illustrating each step of FIG. 15.

The solar cell manufacturing method according to the present embodiment may additionally include a mask forming step S91 before the front surface texturing step S3 of the embodiment described above (see FIG. 4) and may additionally include a mask removing step S92 after the front surface texturing step S3.

Therefore, the solar cell manufacturing method according to the present embodiment may include the control passivation layer deposition step S1, the polycrystalline silicon layer deposition step S2, the mask forming step S91, the front surface texturing step S3, the mask removing step S92, the dopant layer forming step S4, the heat treatment step S5, the cleaning step S6, the passivation layer deposition step S7, and the electrode forming step S8.

In the present embodiment, since a process up to the polycrystalline silicon layer deposition step S2 is the same as the embodiment of FIG. 4 described above, the mask forming step S91 to the mask removing step S92 will be described, descriptions of the same parts as those of the embodiment of FIG. 4 described above will be replaced with the embodiment of FIG. 4 and a detailed description thereof will be omitted.

Figure 18:
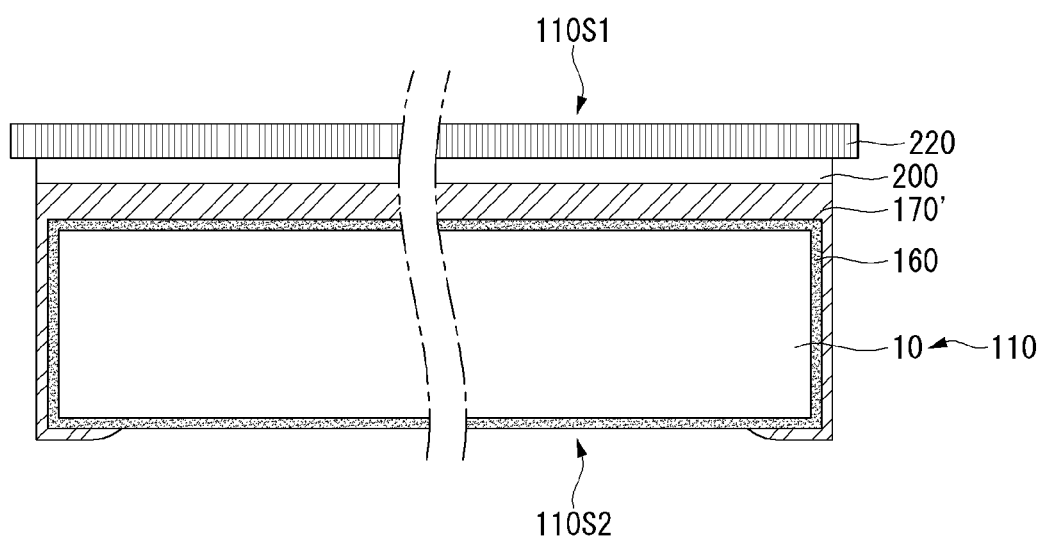

As illustrated in FIG. 15, the mask forming step S91 may be performed between the polycrystalline silicon layer deposition step S2 and the front surface texturing step S3, and as illustrated in FIG. 18, a mask layer 200 for preventing texturing etching ma be formed on the polycrystalline silicon layer 170' on the back surface of the 110.

Figure 16:
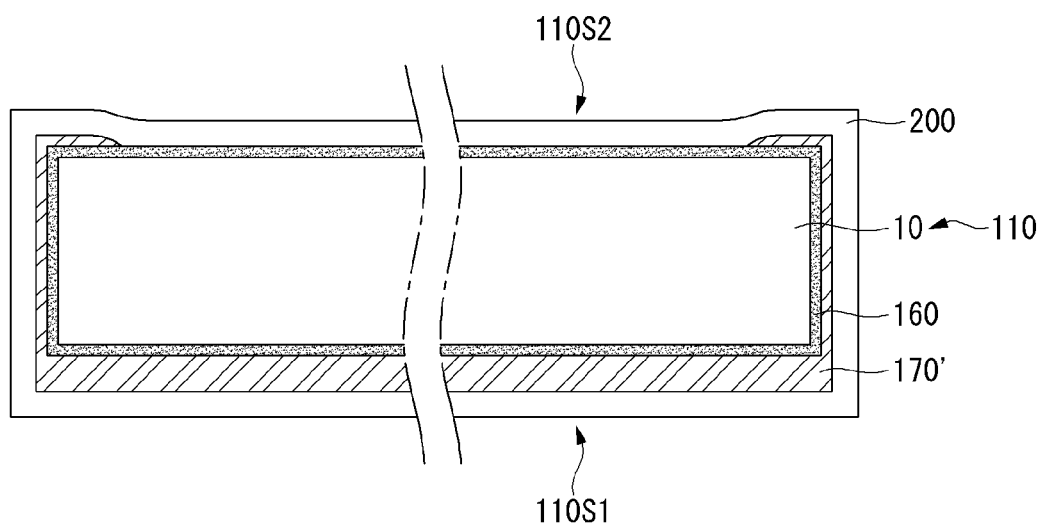
Figure 17:
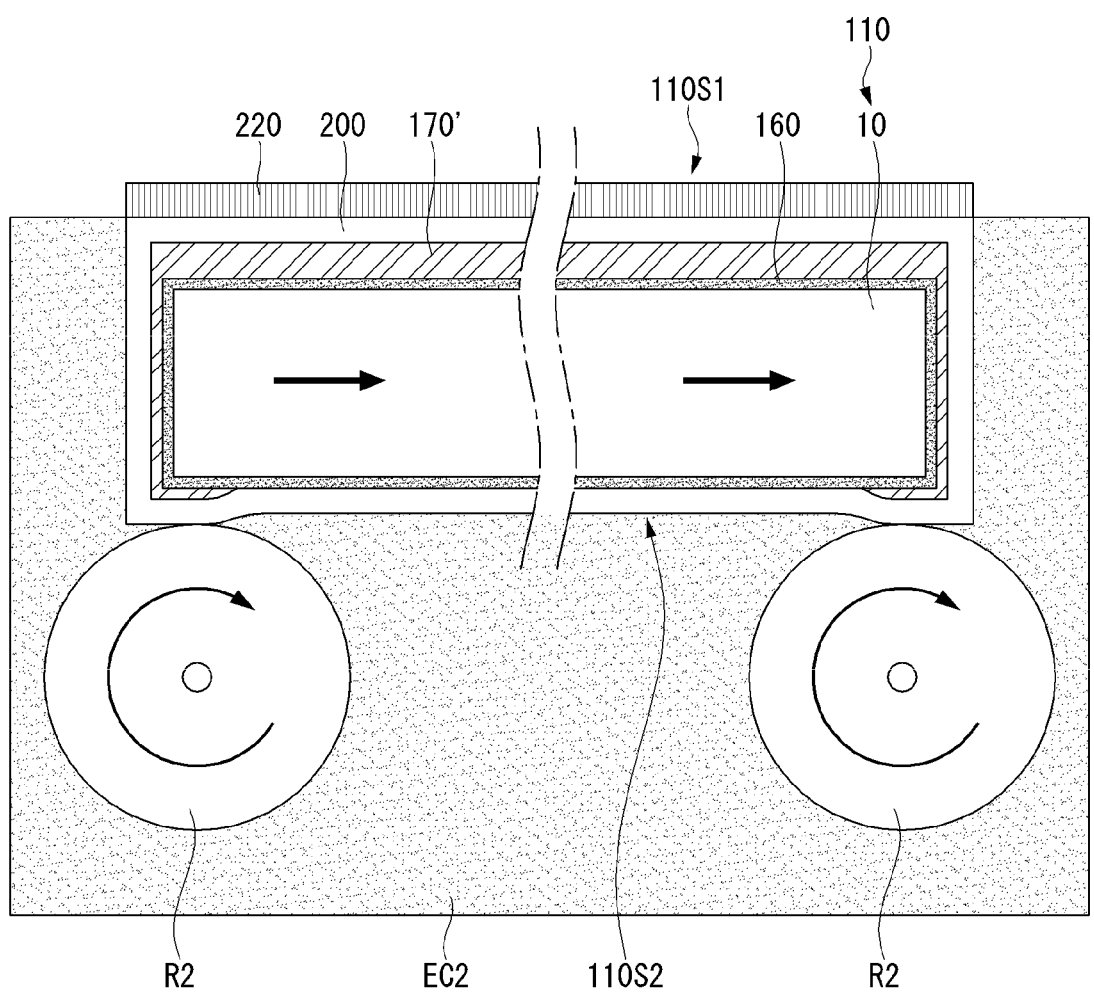

To this end, as illustrated in FIG. 16, in the mask forming step S91, the mask layer 200 is formed on the entire surface of the polycrystalline silicon layer 170' and the entire front surface of the semiconductor substrate 110. As illustrated in FIG. 17, a remaining portion of the mask layer 200 other than a portion thereof formed on the polycrystalline silicon layer 170' positioned on the back surface of the semiconductor substrate 110 may be removed by a mask etching solution EC2 so that the mask layer 200 may remain only on the back surface of the semiconductor substrate 110 as illustrated in FIG. 18.

More specifically, in order to form the mask layer 200 illustrated in FIG. 16, atmospheric pressure chemical vapor deposition (APCVD) or plasma chemical vapor deposition (PECVD) may be used, and silicon oxide (SiOx) or silicon nitride (SiNx) may be entirely formed on the surface of the polycrystalline silicon layer 170' and the front surface of the semiconductor substrate 110.

Thereafter, as illustrated in FIG. 17, the mask layer 200 of the remaining portion excluding the portion formed on the polycrystalline silicon layer 170' disposed on the back surface of the semiconductor substrate 110 may be removed by the mask etching solution EC2 including a hydrofluoric acid diluent (DHF).

In this case, in order to allow the mask layer 200 positioned on the back surface of the semiconductor substrate 110 to remain, as illustrated in FIG. 17, a mask etching prevention layer 220 may be coated on the mask layer 200 positioned on the back surface of the semiconductor substrate 110. The mask etching prevention layer 220 may be formed of a material different from that of the mask layer 200, and may be any material as long as it is not etched by the hydrofluoric acid diluent (DHF).

The mask etching prevention layer 220 may be, for example, in the form of a tape that may be simply adhered to the mask layer 200 for the convenience of the process.

As such, in a state where the mask etching prevention layer 220 is coated, the semiconductor substrate 110 may be immersed in the hydrofluoric acid diluent (DHF) to remove the mask layer 200 of the remaining portion excluding the portion formed on the polycrystalline silicon layer 170' disposed on the back surface of the semiconductor substrate 110.

In order to shorten a process time even in the process of removing the remaining portion of the mask layer 200, in a state where the roller R2 provided in-line is immersed in the hydrofluoric acid diluent (DHF), the roller R2 may be moved to remove the mask layer 200 positioned on the front and side surfaces of the semiconductor substrate 110 to form a structure illustrated in FIG. 18.

Figure 19:
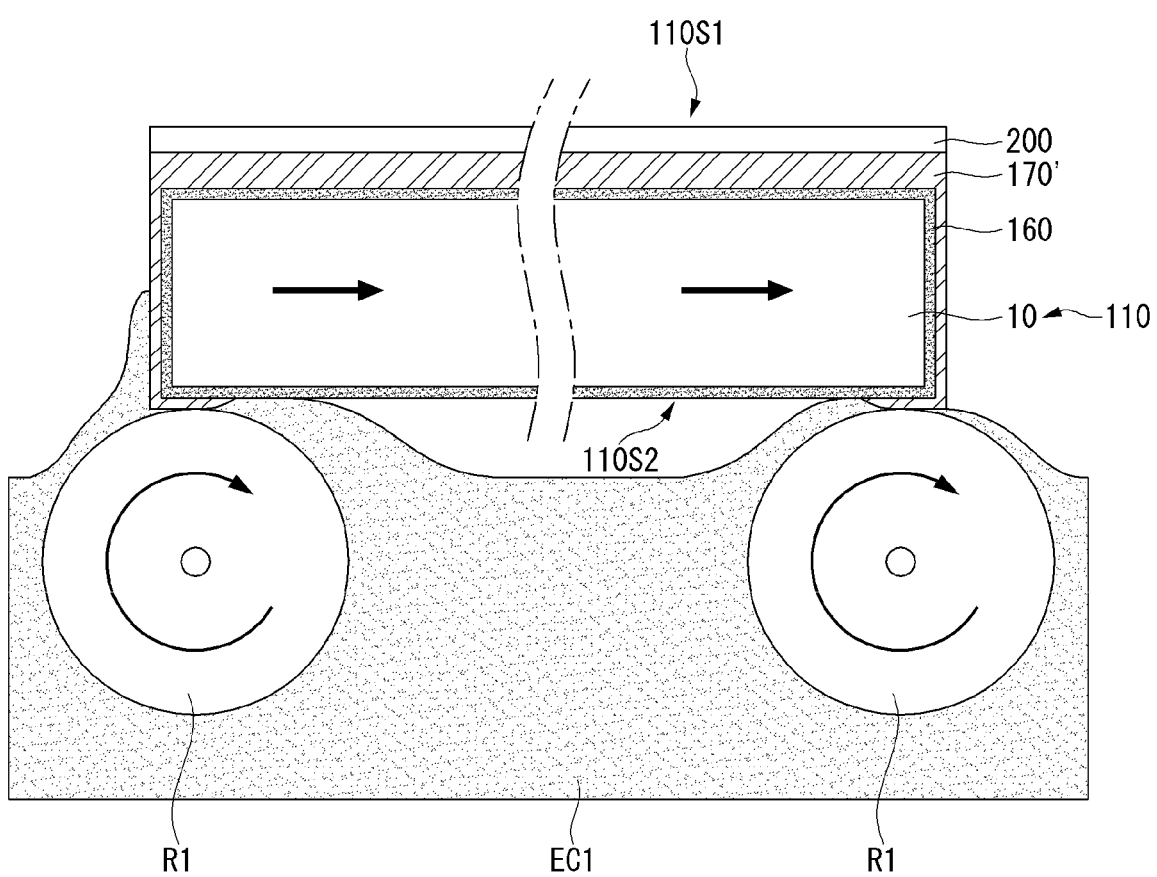

Subsequently, the mask etching prevention layer 220 positioned on the back surface of the semiconductor substrate 110 may be removed, so that the mask layer 200 may remain only on the back surface of the semiconductor substrate 110 as illustrated in FIG. 19.

As illustrated in FIG. 19, the front surface texturing step S3 may be performed in a state where the mask layer 200 is formed on the polycrystalline silicon layer 170' positioned on the back surface of the semiconductor substrate 110. After the front surface texturing step S3 is completed, the mask layer 200 may be removed.

More specifically, in the front surface texturing step S3 of the solar cell manufacturing method according to the present embodiment, (1) the front surface texturing step S3 may be performed using the roller R1 provided in-line as in the embodiment of FIG. 4 described above or (2) the front surface texturing step S3 may be performed by immersing the semiconductor substrate 110 in a bath.

Figure 20:
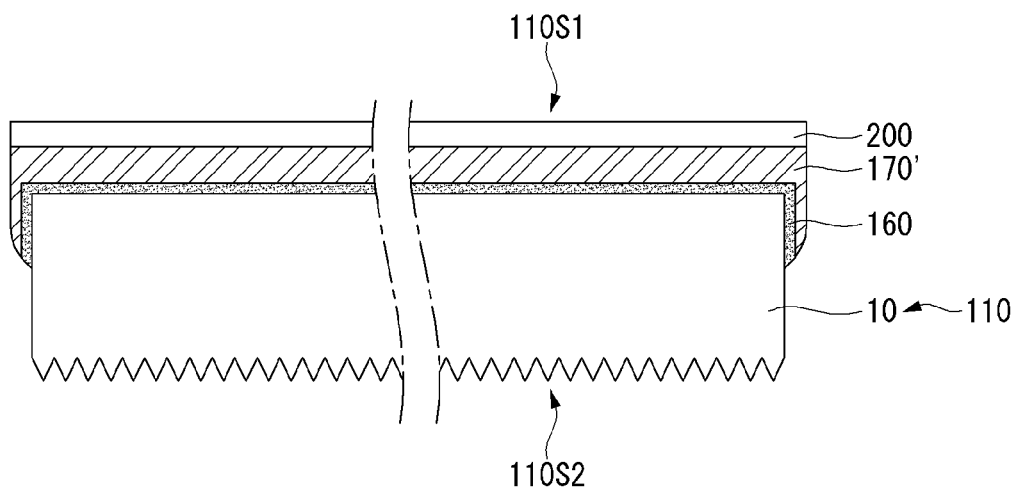
Figure 21:
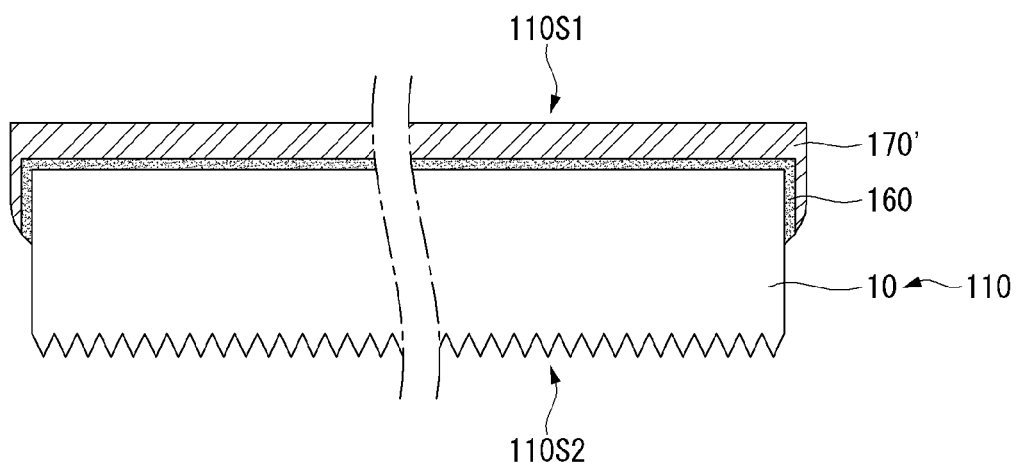

More specifically, in the front surface texturing step S3 of the solar cell manufacturing method according to the present embodiment, in a state where the mask layer 200 is formed on the back surface of the semiconductor substrate 110, (1) the front surface of the semiconductor substrate 110 on which the mask layer 200 is formed is brought into contact with the roller R1 partially immersed in the texturing etching solution EC1 as illustrated in FIG. 19 and the roller is rotated so that the texturing etching solution EC1 present on the surface of the roller R1 etches the front surface of the semiconductor substrate 110 to form textured depressions and protrusions on the front surface of the semiconductor substrate 110 as illustrated in FIG. 20 or (2) the semiconductor substrate 110 including the mask layer 200 is immersed in the texturing etching solution EC1 filled in a bath to form the textured depressions and protrusions on the front surface of the semiconductor substrate 110 as illustrated in FIG. 20.

In addition, in FIG. 20, the case where the textured depressions and protrusions are formed only on the front surface of the semiconductor substrate 110 is illustrated, but, alternatively, the textured depressions and protrusions may also be formed on the side surfaces as well as on the front surface of the semiconductor substrate 110 in the front surface texturing step S3.

Thereafter, in the mask removing step S92, the mask layer 200 remaining on the back surface of the semiconductor substrate 110 may be removed using a hydrofluoric acid diluent (DHF) as illustrated in FIG. 20.

Thereafter, as described in the embodiment of FIG. 4, the dopant layer forming step S4, the heat treatment step S5, the cleaning step S6, the passivation layer deposition step S7, and the electrode forming step S8 may be performed to manufacture the solar cell described above with reference to FIGS. 1 to 3.

In the solar cell manufacturing method according to the present embodiment, the isolation structure may be naturally formed, while texturing the front surface of the semiconductor substrate 110 through the front surface texturing step S3, without a separate isolation step, whereby the manufacturing process may be facilitated.

In addition, since the solar cell manufacturing method of the present disclosure does not use reactive ion etching (RIE) to form the isolation structure, contamination of semiconductor equipment may be prevented, and since an auxiliary device for preventing contamination of the equipment is not required, a manufacturing cost may be further reduced.

In addition, since the solar cell manufacturing method of the present disclosure does not use reactive ion etching (RIE), a uniformity problem for the isolation structure may also be resolved.

In the embodiment of FIG. 4 and the embodiment of FIG. 15 described above, the case where the front surface of the semiconductor substrate is etched by the texturing etching solution EC1 present on the roller R1 when the roller R1 immersed in the texturing etching solution EC1 and in contact with the front surface of the semiconductor substrate 110 rotates in the front surface texturing step has been described as an example.

However, the front surface texturing step included in the solar cell manufacturing method of the present disclosure is not limited to the above-described method and may be performed by other methods. This will be described in more detail with reference to FIG. 22 as follows.

Figure 22:
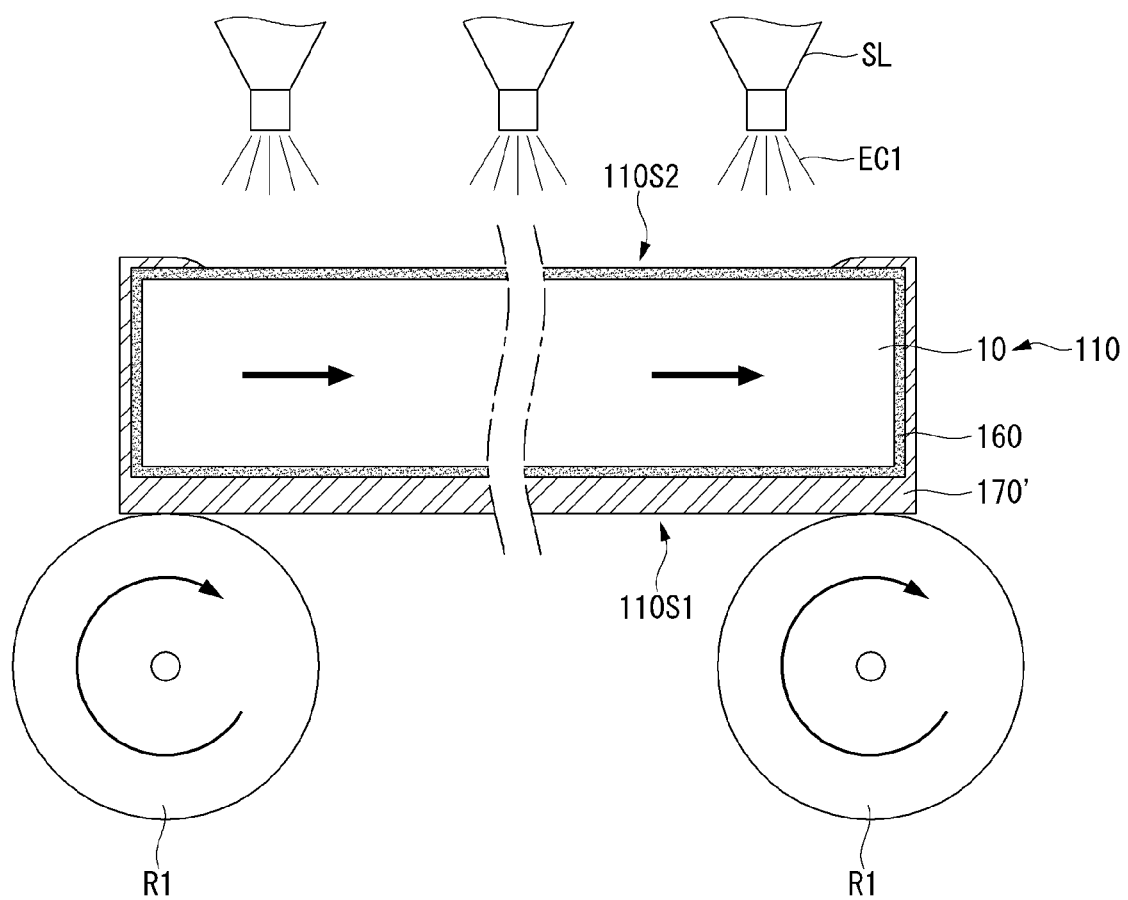
FIG. 22 is a view illustrating another example of a front surface texturing operation illustrated in FIGS. 4 and 15.

FIG. 22 is a view illustrating another example of a front surface texturing step illustrated in FIGS. 4 and 15.

The front surface texturing step according to another embodiment of the present disclosure may be performed, for example, by selectively texturing the front surface of the semiconductor substrate 110 in a spray method in a state where the back surface of the semiconductor substrate 110 is in contact with the roller R1 as shown in FIG. 22, instead of the front surface texturing step S3 of the solar cell manufacturing method according to FIGS. 4 and 8, after the polycrystalline silicon layer deposition step S2 as shown in FIG. 7 is performed.

More specifically, in the front surface texturing step according to another embodiment of the present disclosure, the roller R1 is not immersed in the texturing etching solution, and the texturing etching solution may be sprayed through a spray nozzle.

Accordingly, the front surface texturing step may be performed to selectively texture the front surface of the semiconductor substrate by the texturing etching solution sprayed through the spray nozzle on the front surface of the semiconductor substrate while the semiconductor substrate is transferred in the direction of the arrow by the roller.

By the front surface texturing step (see FIG. 22) according to another embodiment of the present disclosure, the control passivation layer and the polycrystalline silicon layer existing on the front surface of the semiconductor substrate may be etched and completely removed and portions of the control passivation layer and the polycrystalline silicon layer existing on the side surfaces of the semiconductor substrate may be etched to be in a state as illustrated in FIG. 9.

Alternatively, unlike FIG. 9, the control passivation layer and the polycrystalline silicon layer present existing on the side surfaces of the semiconductor substrate may be entirely etched and removed.

Although the case where the front surface texturing step (see FIG. 22) according to another embodiment of the present disclosure is applied to the solar cell manufacturing method of FIG. 4 has been described as an example, the present disclosure is not limited thereto and the front surface texturing step according to another example of the present disclosure may be applied instead of the front surface texturing step S3 of the solar cell manufacturing method of FIG. 15.

That is, after the mask layer forming step S91 in the solar cell manufacturing method of FIG. 15, the front surface texturing step according to another example of the present disclosure may be performed by selectively texturing the front surface of the semiconductor substrate 110 in a spray method in a state where the back surface of the semiconductor substrate 110 is in contact with the roller R1 as illustrated in FIG. 22.

Hereinafter, an isolation structure of a solar cell according to a second embodiment of the present disclosure will be described with reference to FIGS. 23 and 24, and various embodiments of the solar cell manufacturing method for forming an isolation structure of a solar cell according to the second embodiment of the present disclosure will be described with reference to FIGS. 25 to 51.

The solar cell having an isolation structure according to the second embodiment has the same basic configuration as the solar cell illustrated in FIGS. 1 and 2, but there are some differences in positions of formation of each layer or film. In the following description, "A" is indicated after the numeral reference indicating each element.

Accordingly, elements having the same number in the drawings illustrating the isolation structure of the solar cell according to the first embodiment described above and in the drawings illustrating the isolation structure of the solar cell according to the second embodiment below may be regarded as the same elements having the same function.

Figure 23:
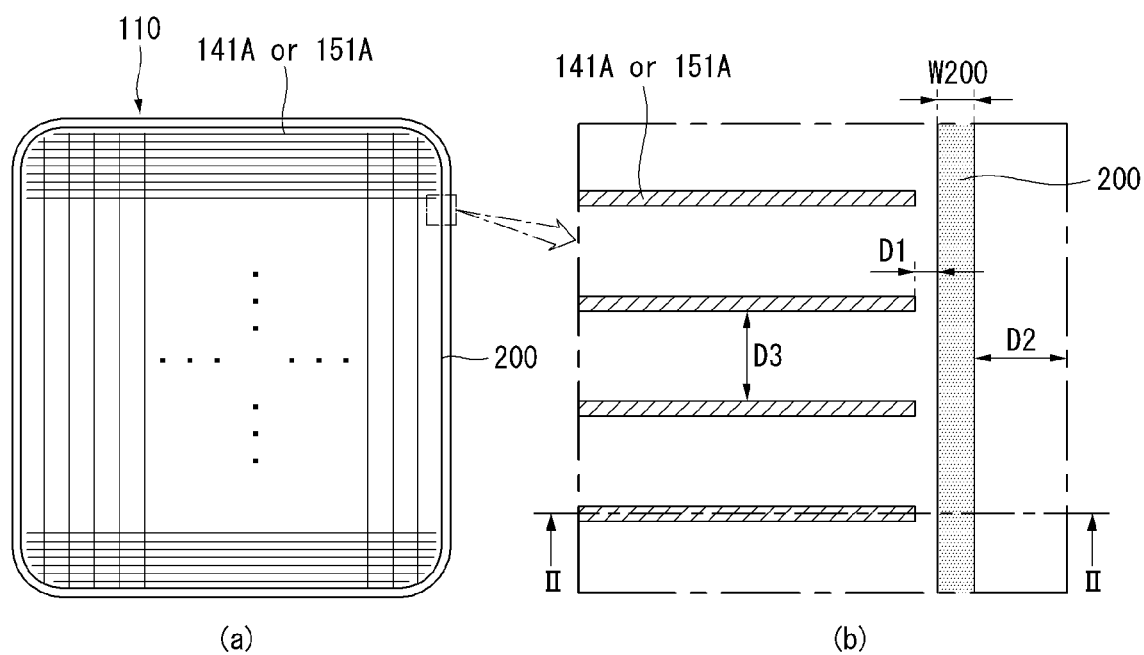
FIG. 23 is a view illustrating an isolation structure of a solar cell according to the second embodiment of the present disclosure.
Figure 24:
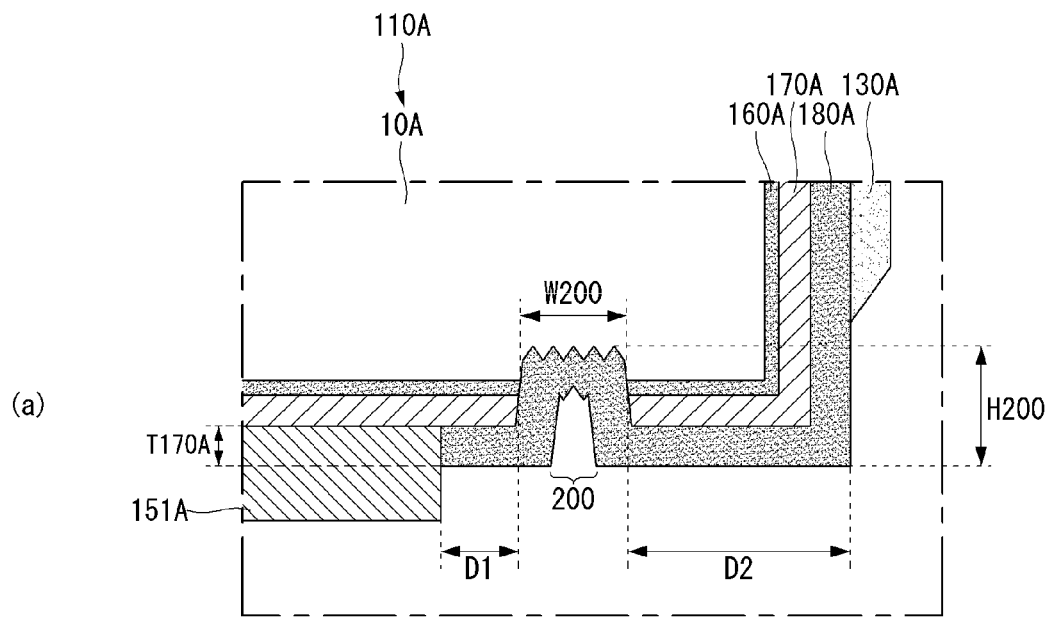
FIG. 24 is a cross-sectional view of an isolation line illustrated in FIG. 23, taken along line II-II of FIG. 23.
Figure 24:
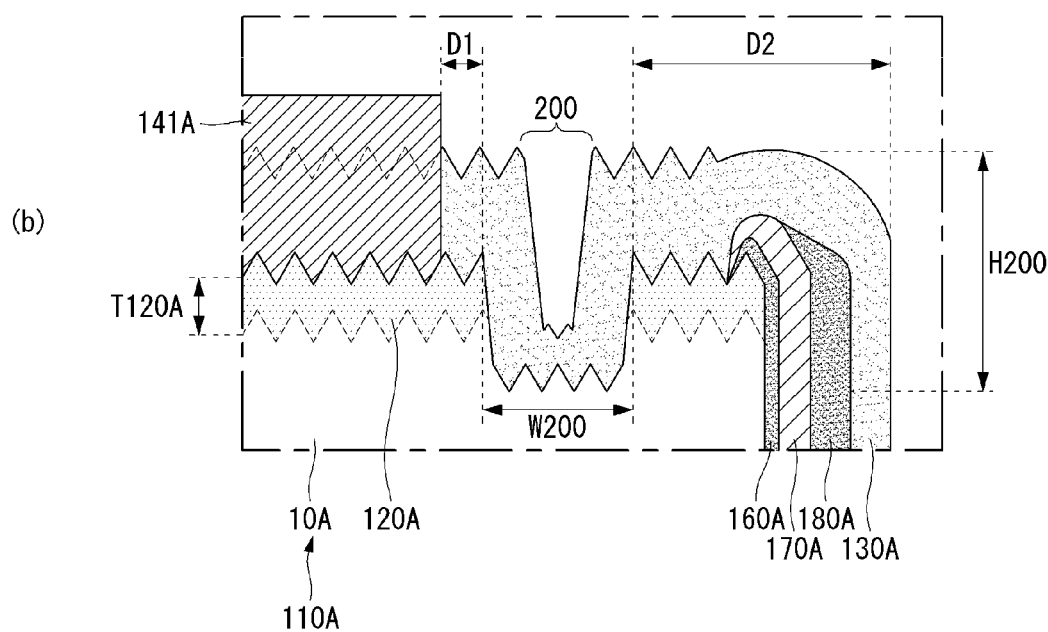

FIG. 23 is a view illustrating an isolation structure of a solar cell according to the second embodiment of the present disclosure, and FIG. 24 is a cross-sectional view of an isolation line 200 illustrated in FIG. 23, taken along line II-II of FIG. 23. (a) of FIG. 23 shows the entire pattern of any one of one surface or the other surface of the solar cell, (b) of FIG. 23 is an enlarged portion of (a) of FIG. 23, (a) of FIG. 24 shows an example of a cross-section of the isolation line 200, and (b) of FIG. 24 shows a modification of the cross-section of the isolation line 200.

As illustrated in (a) and (b) of FIG. 23, the isolation line 200 may be provided between a region where a first electrode 150A is formed or a region where a second electrode 140A is formed and an edge of the semiconductor substrate.

Here, one surface of the semiconductor substrate 110A may be one of the front or back surface of the solar cell, and the other surface of the semiconductor substrate 110A may be the opposite surface of one surface. Hereinafter, a case where one surface of the semiconductor substrate 110A is the back surface of the solar cell and the other surface is the front surface of the solar cell will be described as an example. However, the present disclosure is not limited thereto and vice versa.

The isolation line 200 may be provided on only one surface or the other surface of the semiconductor substrate 110A. For example, when the isolation line 200 is provided on one surface of the semiconductor substrate 110A, the isolation line 200 may not be provided on the other surface of the semiconductor substrate 110A, and conversely, when the isolation line is provided on the other surface of the semiconductor substrate 110A, the isolation line 200 may not be provided on one surface of the semiconductor substrate 110A.

However, the present disclosure is not limited thereto, and the isolation line 200 may be provided on both one side and the other side of the semiconductor substrate 110A.

However, in order to simplify the process, a case where the isolation line 200 is provided on only one surface or the other surface of the semiconductor substrate 110A will be described as an example.

The isolation line 200 may be a line formed by removing a portion of the first conductive region 170A or a portion of the second conductive region 120A and may be spaced apart from the first electrode 150A or the second electrode 140A and provided in a line form parallel to the edge of one surface or the other surface of the semiconductor substrate 110A.

The isolation line 200 may prevent a short circuit between the first conductive region 170A and the second conductive region 120A, thereby preventing efficiency of the solar cell from being lowered.

As illustrated in (b) of FIG. 23, the position of the isolation line 200 may be closer to ends of finger electrodes 151A and 141A than the edges of one or the other surface of the semiconductor substrate 110A.

For example, a distance D1 between the isolation line 200 and the finger electrodes 151A and 141A may be larger than 20 um and may be smaller than a distance D2 between the isolation line 200 and the edge of the semiconductor substrate 110A.

The distance D2 between the isolation line 200 and the edge of the semiconductor substrate 110A may be 2 mm or less in a range smaller than the distance D1 between the isolation line 200 and the finger electrodes 151A and 141A.

The distance D1 between the isolation line 200 and the ends of the finger electrodes 151A and 141A may be larger than a line width W200 of the isolation line 200 and may be smaller than a distance D3 between the finger electrodes 151A and 141A. Here, as an example, the distance D3 between the finger electrodes 151A and 141A may be formed to be 1 mm to 2 mm.

The line width W200 of the isolation line 200 may be formed to be 20 um or greater. Here, line widths of the finger electrodes 151A and 141A may be 20 um to 40 um.

A cross-section of the isolation line 200 is as illustrated in (a) and (b) of FIG. 24.

(a) of FIG. 24 shows a cross-section of the isolation line 200 provided on one surface of the semiconductor substrate and (b) of FIG. 24 illustrates the isolation line 200 provided on the other surface of the semiconductor substrate.

Either of the isolation lines 200 according to (a) and (b) of FIG. 24 may be provided or both may be provided. In the following description, the case where only one of the isolation lines will be described as an example.

As illustrated in (a) and (b) of FIG. 24, a depth H200 of the isolation line 200 formed from the surface of the first conductive region 170A or the second conductive region 120A may be larger than a thickness T170A or T120A of the first conductive region 170A or the second conductive region 120A and may be smaller than 150 times the thickness T170A or T120A of the first conductive region 170A or the second conductive region 120A.

For example, the depth H200 of the isolation line 200 may be formed to be 2 um to 5 um in a range larger than the thickness T170A or T120A of the first conductive region 170A or the second conductive region 120A and, more preferably, formed to be 3 um to 4 um.

For example, as illustrated in (a) of FIG. 24, when the isolation line 200 is provided on one surface of the semiconductor substrate 110A, the thickness T170A of the first conductive region 170A may be 300 nm to 400 nm and the depth H200 of the isolation line 200 may be formed of 2 um to 5 um.

In addition, as illustrated in (b) of FIG. 24, when the isolation line 200 is provided on the other surface of the semiconductor substrate 110A, the thickness T120A of the second conductive region 120A may be formed to be about 1.5 um to 2.5. um and the depth H200 of the isolation line 200 may be formed to be 2 um to 5 um in a range larger than the thickness of the second conductive region 120A.

Here, as illustrated in (a) of FIG. 24, when the isolation line 200 is positioned on one surface of the semiconductor substrate 110A, the first passivation layer 180A may be in contact with a base region 10A of the semiconductor substrate 110A through the first conductive region 170A and the control passivation layer 160A at a portion where the isolation line 200 is positioned. That is, the first passivation layer 180A may be in direct contact with the base region 10A of the semiconductor substrate 110A.

Alternatively, as illustrated in (b) of FIG. 24, when the isolation line 200 is positioned on the other surface of the semiconductor substrate 110A, the second passivation layer 130A may be in contact with the base region 10A of the semiconductor substrate 110A through the second conductive region 120A at the portion where the isolation line 200 is positioned. That is, the second passivation layer 130A may be in direct contact with the base region 10A of the semiconductor substrate 110A.

In the solar cell having the isolation structure of such a configuration, since the isolation line 200 is formed at the edge of one surface or the other surface of the semiconductor substrate 110A by etching paste, the isolation line 200 may be formed uniformly in depth H200 in the entire region of one surface or the entire region of the other surface of the semiconductor substrate 110A, while minimizing contamination of the semiconductor equipment, thereby minimizing a defective rate for the edge isolation structure.

Hereinafter, a method of manufacturing a solar cell having such an isolation line 200 will be described.

FIGS. 25 to 35 are views illustrating a first embodiment of a solar cell manufacturing method for forming an isolation structure of a solar cell according to a second embodiment of the present disclosure.

The solar cell manufacturing method according to the present embodiment may include a texturing step S11, a control passivation layer deposition step S12, a first conductive region 170A forming step S13/S15, a second conductive region 120A forming step S14/S15, an isolation step S16, a passivation layer deposition step S17, and an electrode forming step S18.

The first conductive region 170A forming step S13/S15 may include a polycrystalline silicon layer deposition step S13 and a heat treatment step S15, and the second conductive region 120A forming step S14/S15 may include a dopant layer forming step S14 and the heat treatment step S15. The isolation step S16 may be performed after the first and second conductive region forming steps are completed, and may include a coating step S61, an etching step S62, and a cleaning step S63.

Figure 26:
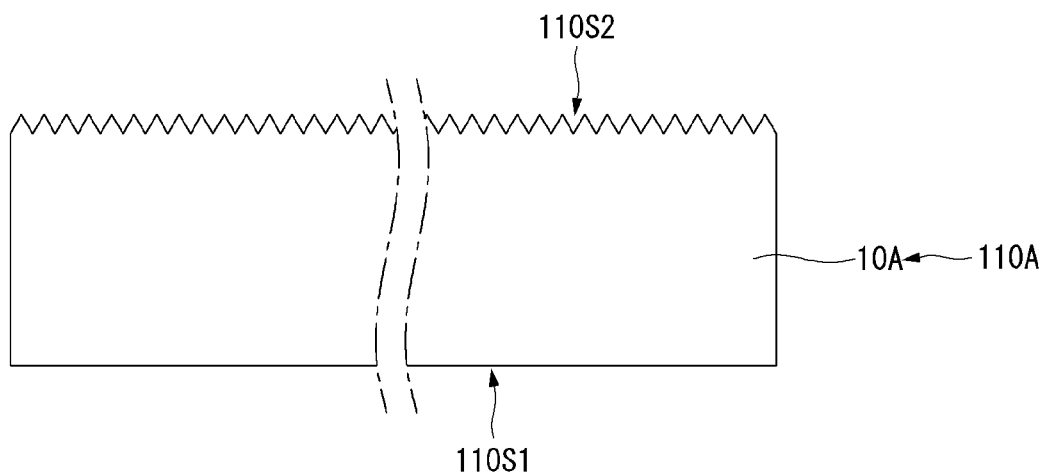

In the texturing step S11, depressions and protrusions may be formed by texturing one surface 110S1 and the other surface 110S2 of the semiconductor substrate 110 or the other surface 110S2 of the semiconductor substrate 110. For example, as illustrated in FIG. 26, in the texturing step S11, textured depressions and protrusions may be formed on the other surface 110S2 of the semiconductor substrate 110A.

More specifically, after the textured depressions and protrusions are formed on one surface 110S1 and the other surface of the semiconductor substrate 110A, the surface 110S1 of the semiconductor substrate 110 may be polished to remove the textured depressions and protrusions, thereby forming the textured depressions and protrusions only on the other surface 110S2 of the substrate 110A. However, the texturing step S11 is not limited to the case illustrated in FIG. 26 and may be modified. Hereinafter, the case as illustrated in FIG. 26 will be described as an example for convenience of description.

Figure 27:
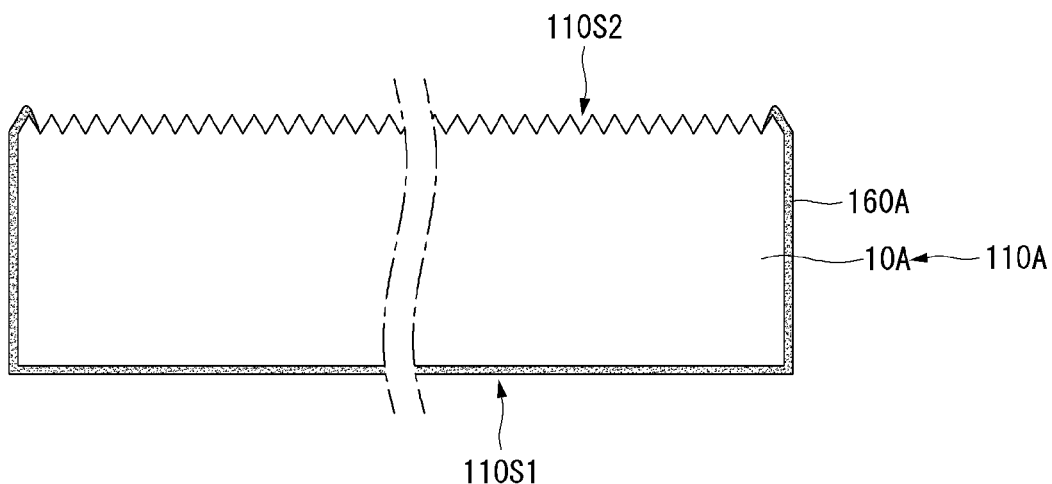

In the control passivation layer deposition step S17, as illustrated in FIG. 27, the control passivation layer 160A may be formed on one surface 110S1 and the side surface of the semiconductor substrate 110A. To this end, the control passivation layer 160A may be deposited on one surface 110S1 and the side surface of the semiconductor substrate 110A by an oxide film deposition method. Here, for a single-surface deposition, two semiconductor substrates 110A may be folded to face each other, and then an oxide film may be deposited.

In the first conductive region 170A forming step, a first conductive region 170A doped with a first conductivity type dopant may be formed on the polycrystalline silicon layer 170' positioned on one surface 110S1 of the semiconductor substrate 110A having the base region 10A, i.e., on the polycrystalline silicon layer 170A positioned on the control passivation layer 160A. To this end, the first conductive region 170A forming step may include the polycrystalline silicon layer deposition step S13 and the heat treatment step S15.

In the second conductive region 120A forming step, the second conductive region 120A doped with the second conductivity type dopant opposite to the first conductive region 170A may be formed on the other surface 110S2 of the semiconductor substrate 110A. To this end, the second conductive region 120A forming step may include the dopant layer forming step S14 and the heat treatment step S15.

In addition, the heat treatment step S15 of forming the first conductive region 170A forming step and the heat treatment step S15 of the second conductive region 120A forming step may be simultaneously performed.

Hereinafter, the case where the dopant layer forming step S14 is performed after the polycrystalline silicon layer deposition step S13 will be described as an example, but alternatively, the polycrystalline silicon layer deposition step S13 may be performed after the dopant layer forming step S14 is performed.

Figure 28:
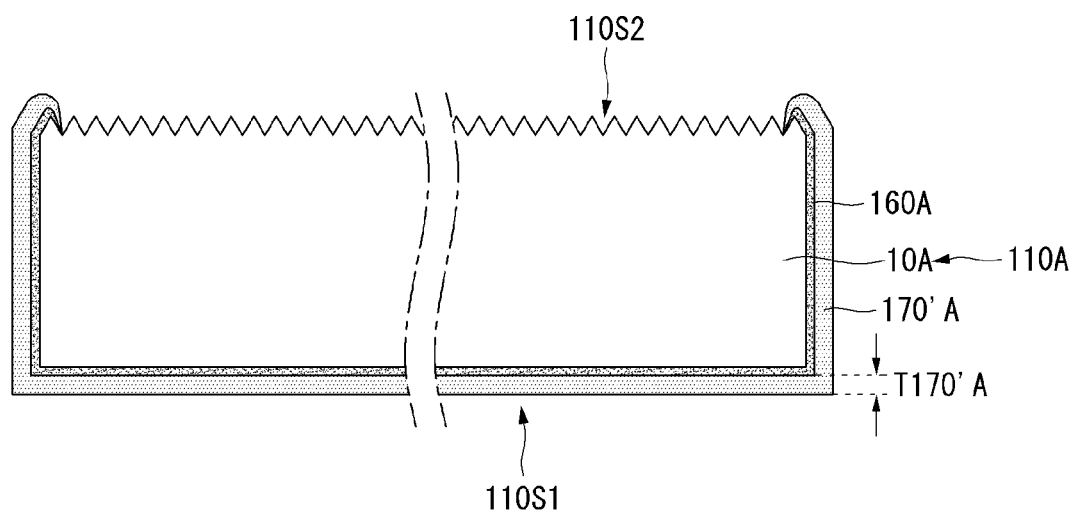

In the polycrystalline silicon layer deposition step S13, as illustrated in FIG. 28, in order to form the first conductive region 170A, a polycrystalline silicon layer 170'A may be deposited with a thickness of 200 nm to 400 nm on one surface 110S1 of the semiconductor substrate 110A, i.e., on the control passivation layer using CVD equipment. Here, in order to prevent the polycrystalline silicon layer 170'A from being deposited on an unnecessary surface, the polycrystalline silicon layer 170'A may be deposited in a state in which two semiconductor wafers are folded to face each other for a single-surface deposition.

Here, the polycrystalline silicon layer may also be formed on the side surfaces of the semiconductor substrate 110A to have a thickness smaller than a thickness formed on one surface 110S1 of the semiconductor substrate 110A, as well as on one surface 110S1 of the semiconductor substrate 110A, and may also be partially deposited on an edge portion of the other surface 110S2 of the semiconductor substrate 110A. Here, unlike a central portion of the semiconductor substrate in which the polycrystalline silicon layer 170'A is deposited in the range of 200 nm to 400 nm, the polycrystalline silicon layer 170'A may be deposited to have a thickness of about 1 um at the edge portion. The first conductivity type dopant may be doped into the polycrystalline silicon layer 170'A.

In addition, in the polycrystalline silicon layer deposition step S13 of the present embodiment, a case where the polycrystalline silicon layer 170'A is deposited on one surface 110S1 of the semiconductor substrate 110A from the beginning will be described as an example, but the present disclosure is not limited thereto. That is, an amorphous silicon layer may be deposited on one surface 110S1 of the semiconductor substrate 110A and the amorphous silicon layer may be heat-treated in the follow-up heat treatment step S15 to form the polycrystalline silicon layer 170'A. Here, however, the amorphous silicon layer should be deposited thicker by about a few micrometers than the polycrystalline silicon layer.

Figure 29:
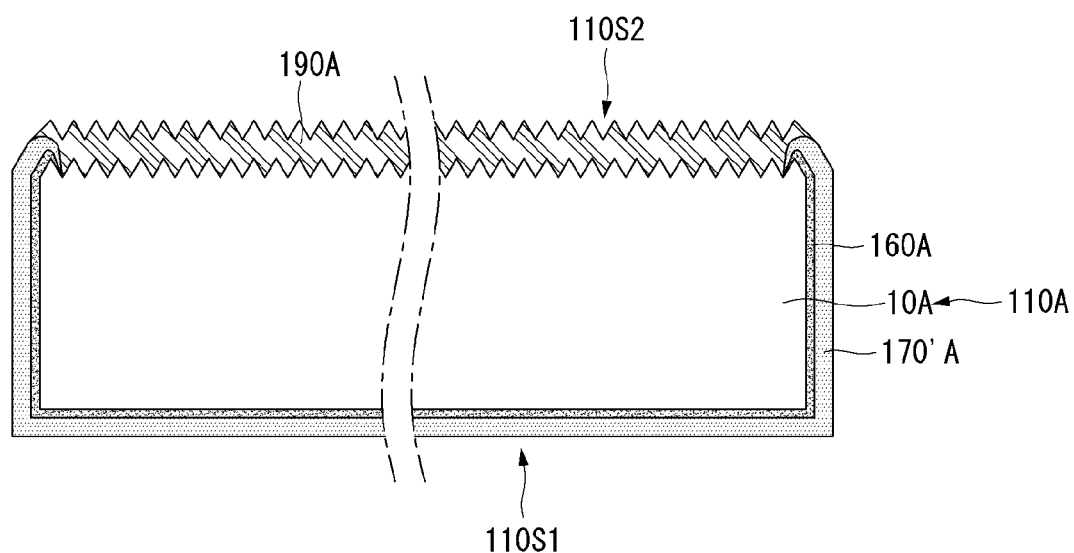

As illustrated in FIG. 29, in the dopant layer forming step S14, a dopant layer 190A containing the second conductivity type dopant may be formed on the other surface 110S2 of the semiconductor substrate 110A to form the second conductive region 120A. The dopant layer 190A may be, for example, a borosilicate glass (BSG) film. However, the present disclosure is not limited thereto, and the dopant layer 190A may only need to include a conductivity type dopant opposite to the first conductive region 170A. For example, a phosphor silicate glass (PSG) film or another conductivity type dopant may be contained.

As illustrated in FIG. 29, both ends of the dopant layer 190A formed on the other surface 110S2 of the semiconductor substrate 110A by the dopant layer forming step may be connected to an end of the polycrystalline silicon layer 170'A containing the first conductivity type dopant in an overlapping manner.

The heat treatment step S15 may be performed, for example, after the polycrystalline silicon layer deposition step S13 and the dopant layer forming step S14 and before the coating step S61 of the isolation step S16. For example, the semiconductor substrate 110A may be heat-treated at 800° C. to 1000° C.

Figure 30:
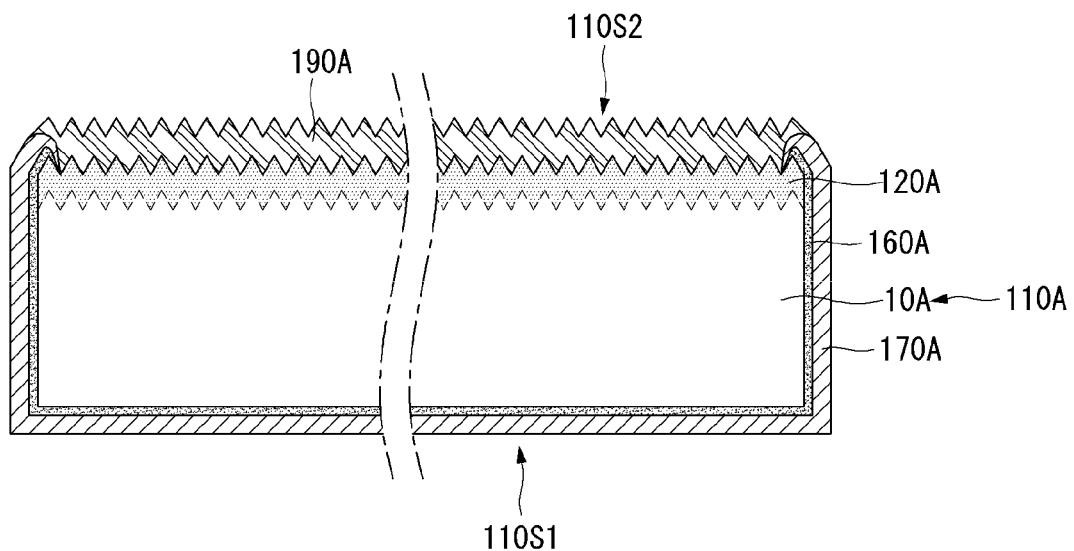

As illustrated in FIG. 30, the first conductivity type dopant contained in the polycrystalline silicon layer 170'A may be activated by the heat treatment step S15 so that the polycrystalline silicon layer 170' may be formed as the first conductive region 170A, and the second conductivity type dopant contained in the dopant layer 190A may be diffused into the other surface 110S2 of the semiconductor substrate 110A to form the second conductive region 120A at a portion of the base region 10A of the semiconductor substrate 110A.

Here, the thickness T170A of the first conductive region 170A may be 300 nm to 400 nm, and the thickness T120A of the second conductive region 120A may be 0.1 um to 2.5 um.

Figure 31:
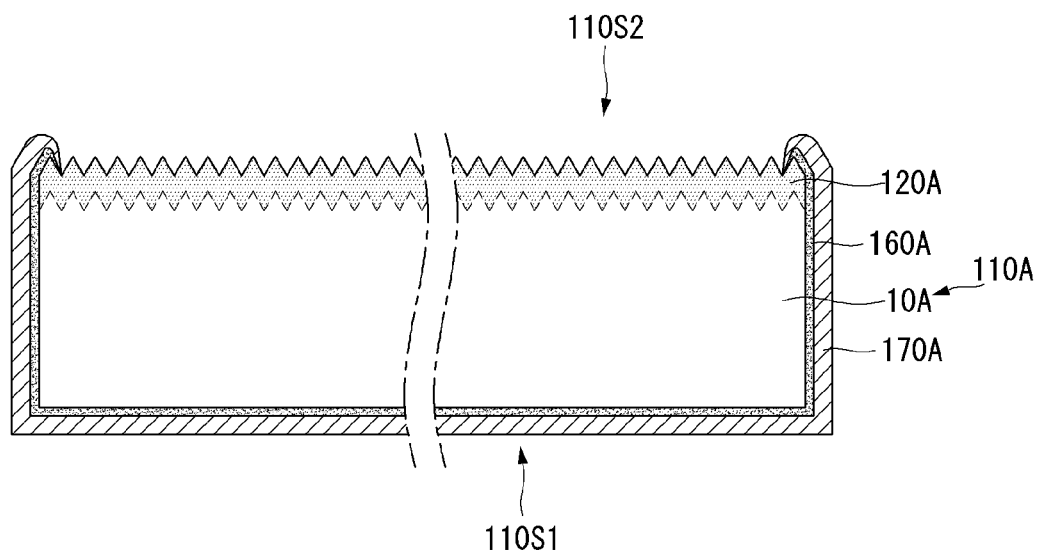

After the heat treatment step S15, as illustrated in FIG. 31, the dopant layer 190 provided on the other surface 110S2 of the semiconductor substrate 110A may be removed through a separate etching solution. Here, the semiconductor substrate 110A or the first and second conductive regions may not be etched.

Even after the dopant layer 190A is removed as described above, the structure in which ends of the first conductive region 170A and the second conductive region are in contact with each other at the edge portion of the other surface 110S2 of the semiconductor substrate 110A as illustrated in FIG. 31, which may degrade efficiency of the solar cell.

Accordingly, the isolation step S16 of removing a short circuit between the first conductive region 170A and the second conductive region 120A may be performed.

The isolation step S16 may be performed after the heat treatment step S15 as in the present embodiment. However, this is merely an example, and alternatively, the isolation step S16 may be performed between a step performed later among the polycrystalline silicon layer deposition step S13 and the dopant layer forming step S14 and the heat treatment step S15 and may also be performed between the polycrystalline silicon layer deposition step S13 and the dopant layer forming step S14.

The isolation step S16 may include a coating step S61, an etching step S62, and a cleaning step S63.

By the isolation step S16, the first conductive region 170A and the second conductive region 120A may be electrically insulated from each other, and a portion of the semiconductor substrate 110A may be etched from one surface 110S1 or the other surface 110S2 of the semiconductor substrate 110A to form the isolation line 200 in which a portion of the first conductive region 170A or the second conductive region 120A is removed.

For the isolation step S16, an etching paste 210 may be applied to be adjacent to the edge of one surface 110S1 or the other surface 110S2 of the semiconductor substrate 110A in the coating step S61.

Figure 32:
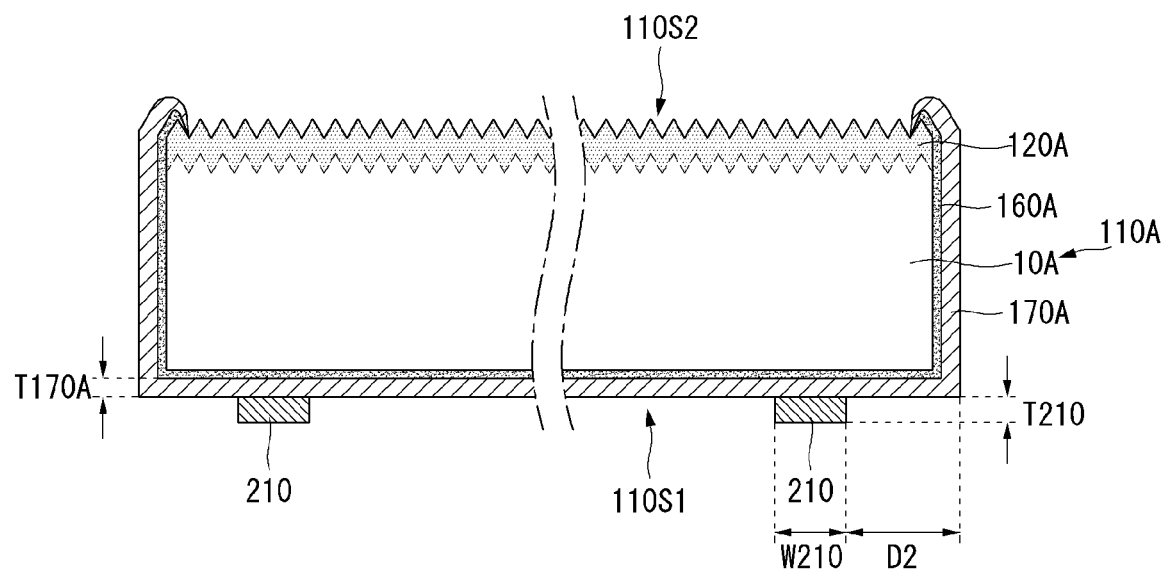

As a specific example, as illustrated in FIG. 32, the etching paste 210 may be applied to be spaced apart from the edge of the first conductive region 170A provided on one surface 110S1 of the semiconductor substrate 110A.

Here, as shown in (a) of FIG. 23, the etching paste 210 applied to the edge of the first conductive region 170A of the semiconductor substrate 110A may be applied outside a region in which the finger electrode 151A is formed on one surface 110S1 of the semiconductor substrate 110A and applied in parallel to the edge of the semiconductor substrate 110A and may have a closed loop shape overall.

The etching paste 210 may be applied at a distance D2 of 2 mm or less from the edge of the first conductive region 170A.

Here, the aspect ratio of the etching paste 210, i.e., thickness T210/line width W210 of the etching paste 210, may be 0.1 to 1. Here, the thickness T210 of the etching paste 210 may be, for example, 2 um to 500 um, the line width W210 of the etching paste 210 may be 20 um to 500 um in a range equal to or greater than the thickness T210 of the etching paste 210.

The etching paste 210 may include polymer particles and an etching material. The polymer particles may include at least one of polystyrene, polyacrylate, polyamide, polyimide, and polymethacrylate, melamine, urethane, benzo guanine, phenolic resin, silicone resin, fluorinated polymers and micronized wax, and the etching material may include at least one of ammonium difluoride ($NH_4HF_2$) and phosphoric acid ($H_3PO_4$).

Figure 33:
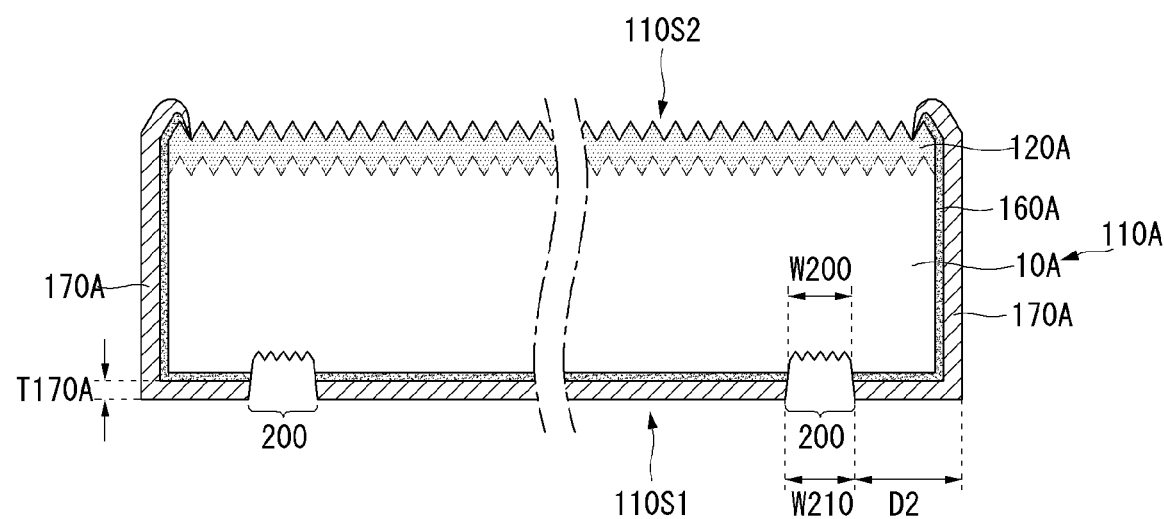

In the etching step S62, a portion of the semiconductor substrate 110 adjacent to the edge may be etched using the etching paste 210 to form the isolation line 200 as illustrated in FIG. 33.

In the etching step S62, when the etching material of the etching paste 210 contains ammonium difluoride ($NH_4HF_2$), the etching step S62 may be performed in a range of 15° C. to 40° C. When the etching material of the etching paste 210 contains phosphoric acid ($H_3PO_4$), the etching step S62 may be performed for 1 minute to 5 minutes in a range of 400° C. to 450° C.

As illustrated in FIG. 33, a line width W200 of the isolation line 200 etched in the etching step S62 may be 20 um to 500 um and a depth H200 of the isolation line etched in the etching step S62 may be 2 um to 5 um in a range larger than the thickness T170A of the first conductive region 170A. More specifically, the isolation line 200 may have a depth of 3 um to 4 um in a range larger than the thickness T 170A of the first conductive region 170A.

Thus, not only a portion of the first conductive region 170A but also a portion of the base region 10A of the semiconductor substrate 110A may be etched in the etching step S62.

Accordingly, in the etching step S62, a portion of the first conductive region 170A may be etched to expose the base region 10A of the semiconductor substrate 110A.

Accordingly, the first conductive region 170A electrically connected to the second conductive region 120A at the edge portion of the other surface 110S2 of the semiconductor substrate 110A, i.e., the first conductive region 170A positioned outside the isolation line 200 at the edge portion of the other surface 110S2 of the semiconductor substrate 110A, the side surface, and the one surface 110S1 of the semiconductor substrate 110A may be electrically isolated from the first conductive region 170A positioned inside the isolation line 200 on one surface 110S1 of the semiconductor substrate 110A, and thus, the first conductive region 170A and the second conductive region 120A may be electrically isolated from each other.

Thereafter, the cleaning step S63 may be performed to remove the etching paste 210.

In the washing step S63, deionized water (DI) in which organic solvents such as IPA, ethanol, and methanol which are general paste cleaning materials are diluted may be used. For example, 0.1 wt % of KOH may be added to the deionized water.

Figure 34:
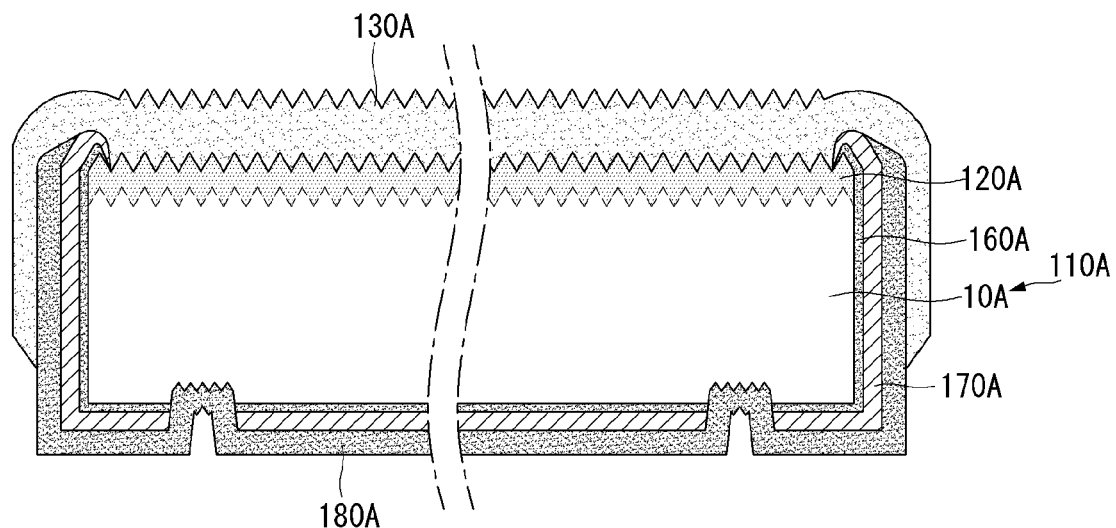

After the isolation step S16 is finished, as illustrated in FIG. 34, in the passivation layer deposition step S17, the first passivation layer 180A may be deposited on the first conductive region 170A and the second passivation layer 130A may be deposited on the second conductive region 120A.

FIG. 34 illustrates an example in which the first passivation layer 180A is first deposited and the second passivation layer 130A is then deposited. However, deposition order of the first and second passivation layers 180A and 130A is not limited thereto, and conversely, the second passivation layer 130A may be deposited first and the first passivation layer 180A may then be deposited.

As described above, since the first passivation layer 180A is deposited on the first conductive region 170A where the isolation line 200 is formed, the first passivation layer 180A may be formed to be in contact with the base region 10 of the semiconductor substrate 110A through the first conductive region 170A at the portion where the isolation line 200 is positioned, and the first passivation layer 180A may be formed in contact with the first conductive region 170A at a portion where the isolation line 200 is not positioned.

Accordingly, the base region 10A of the semiconductor substrate 110A exposed in the etching step S62 may be covered by the first passivation layer 180A in the passivation layer deposition step S17, and thus, the base region 10A of the semiconductor substrate 110A exposed at the isolation line 200 may be passivated by the first passivation layer 180A.

In addition, the second passivation layer 130A may be formed to be in contact with the second conductive region 120A on the other surface 110S2 of the semiconductor substrate 110A.

Figure 35:
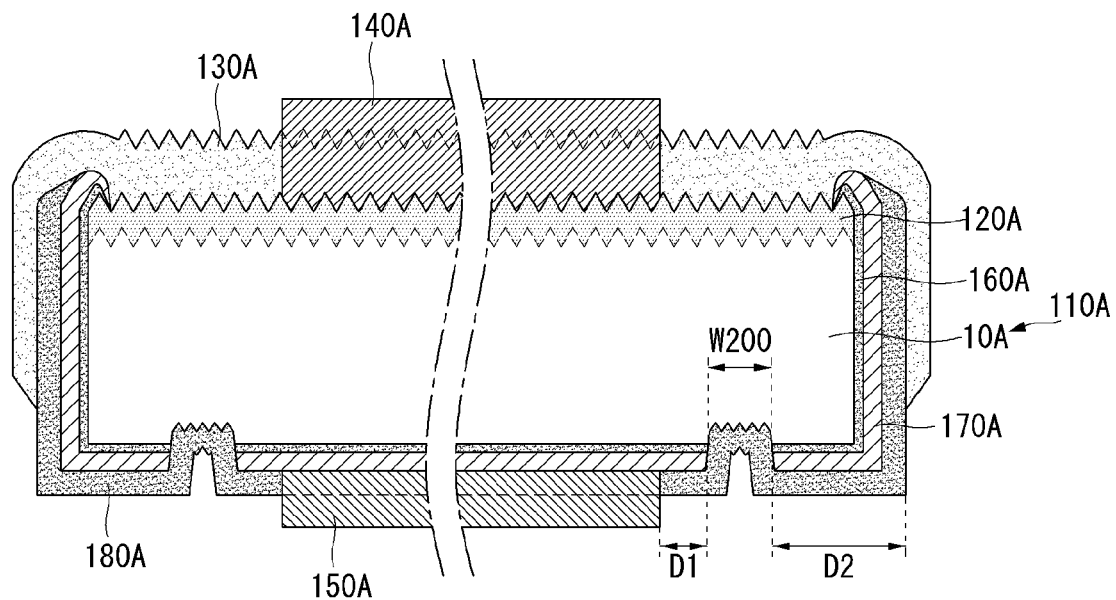

Thereafter, in the electrode forming step S18, as illustrated in FIG. 35, the first electrode 150A connected to the first conductive region 170A through the first passivation layer 180A and the second electrode 140A connected to the second conductive region 120A through the second passivation layer 130A may be formed.

Here, the first electrode 150A and the second electrode 140A may be formed inside the isolation line 200, and patterns of the first and second electrodes 150A and 140A may be the same as those described above with reference to FIGS. 1 and 2 and FIGS. 23 and 24.

Accordingly, the solar cell described above with reference to FIGS. 1 and 2 and (a) of FIGS. 23 and 24 may be manufactured.

Hereinabove, the example of the method of forming the isolation line 200 on one surface 110S1 of the semiconductor substrate 110A has been described. Hereinafter, a modification of the first embodiment in which the isolation line 200 is formed on the other surface 110S2 of the semiconductor substrate 110 will be described.

The solar cell manufacturing method according to the present embodiment may have the same process order as the solar cell manufacturing method according to the first embodiment of FIGS. 25 to 35.

Figure 25:
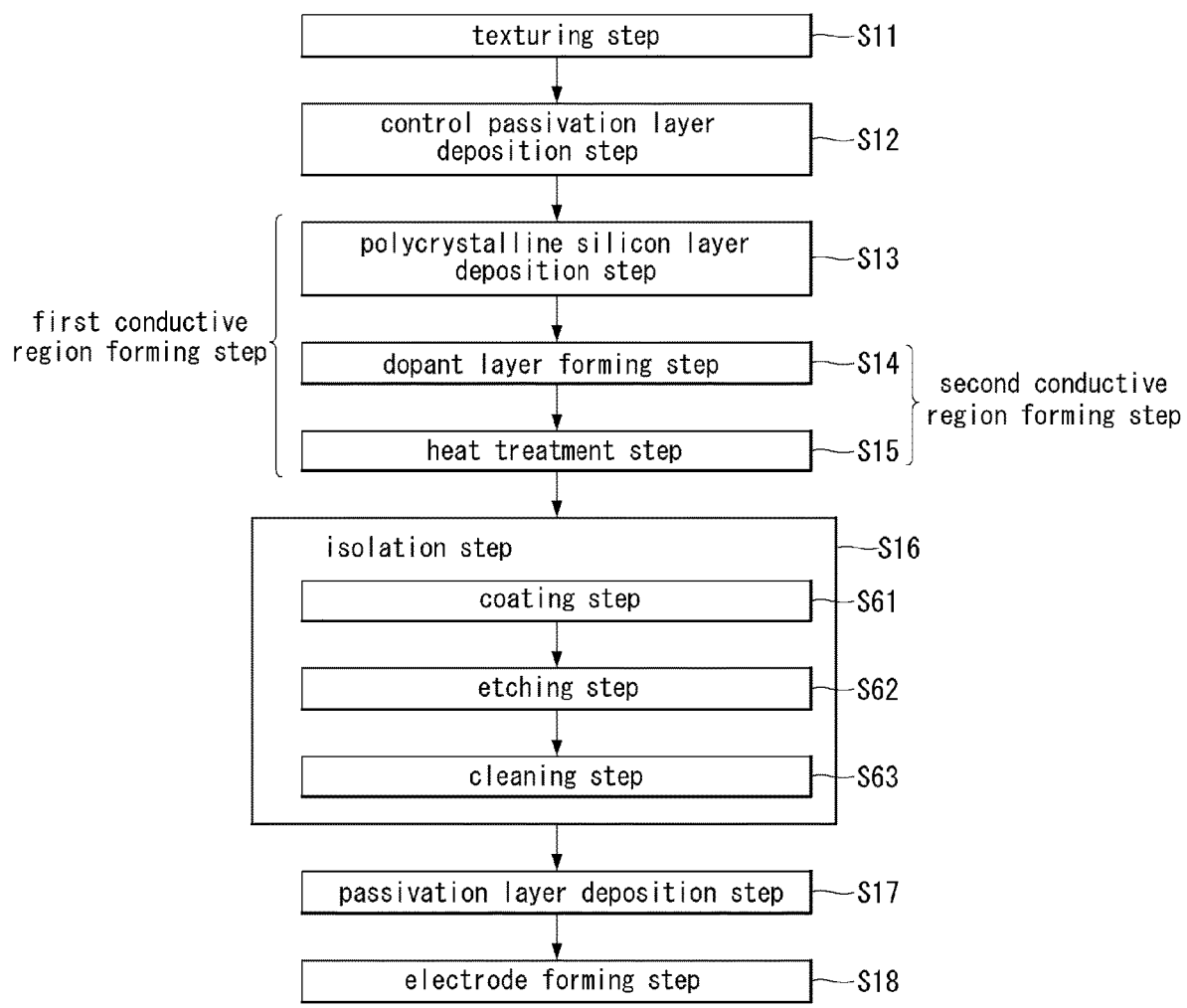
FIGS. 25 to 35 are views illustrating a first embodiment of a solar cell manufacturing method for forming an isolation structure of a solar cell according to the second embodiment of the present disclosure.

However, an isolation line may be formed on the other surface 110S2 of the semiconductor substrate 110A in the isolation step S16 of the solar cell manufacturing method according to the first embodiment illustrated in FIG. 25.

The solar cell manufacturing method according to the present modification may include the texturing step S11, the control passivation layer deposition step S12, the first conductive region 170A forming step S13/S15, the second conductive region 120A forming step S14/S15, the isolation step S16, the passivation layer deposition step S17, and the electrode forming step S18. Therefore, hereinafter, descriptions of the same process configuration and order as those of the first embodiment illustrated in FIGS. 25 to 35 will be omitted, and different parts will be mainly described.

Figure 36:
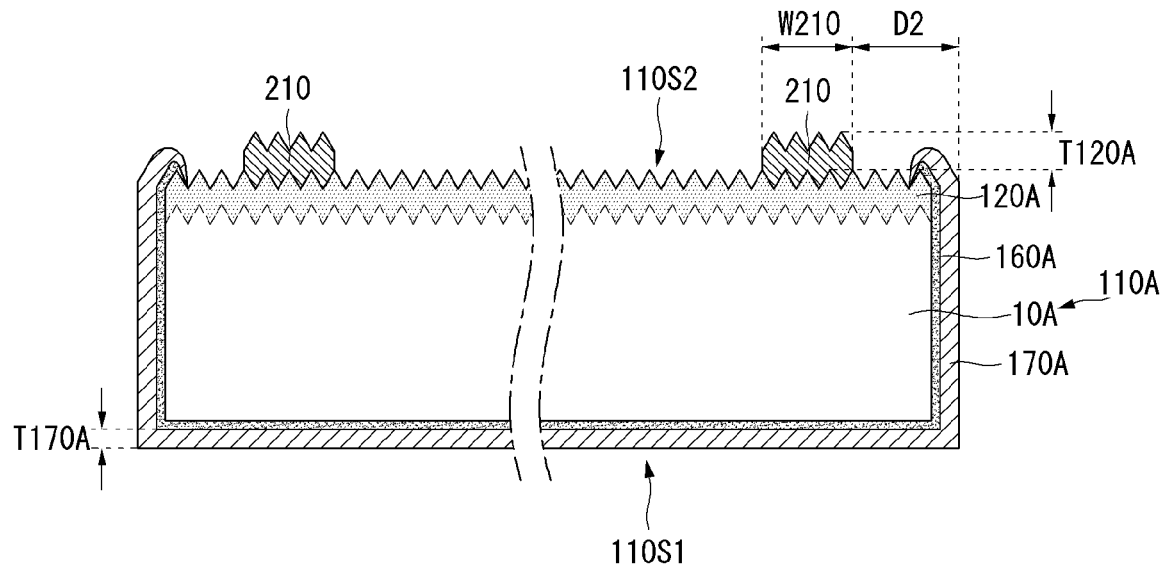
FIGS. 36 to 39 are views illustrating a modification of the first embodiment illustrated in FIGS. 25 to 35.
Figure 37:
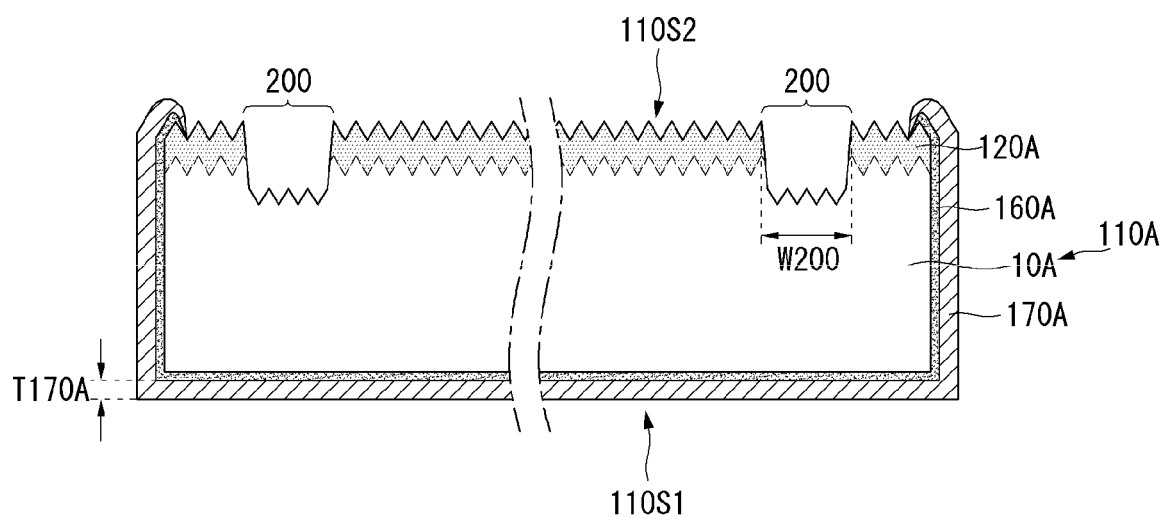
Figure 38:
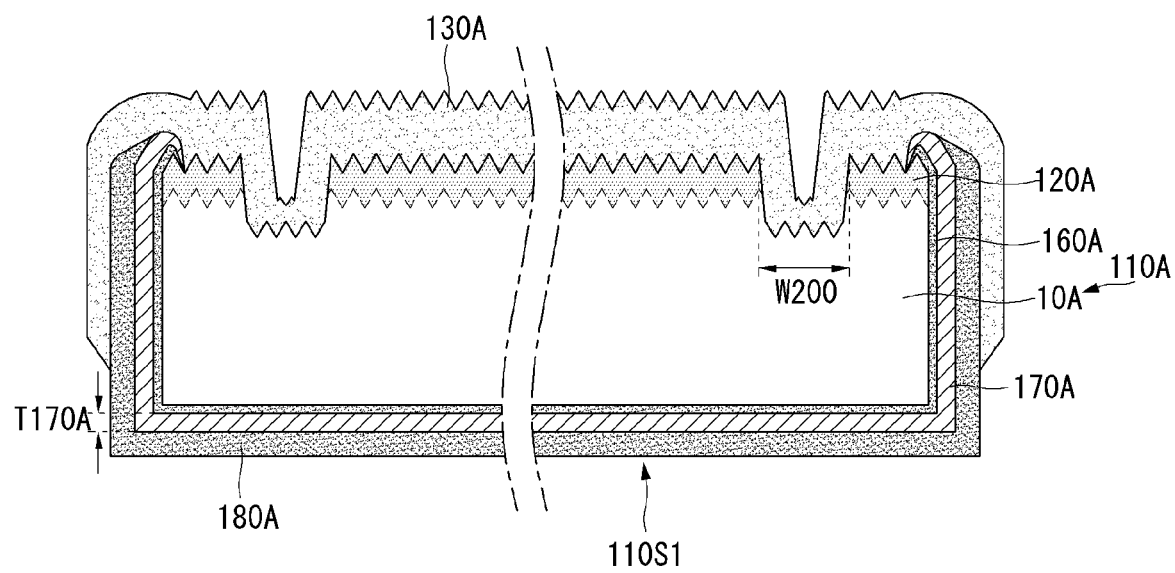

In the solar cell manufacturing method according to the present modification, after the heat treatment step S15 illustrated in FIG. 25, the etching paste 210 may be applied to be adjacent to the edge of the other surface 110S2 of the semiconductor substrate 110A in the coating step S61 as illustrated in FIG. 36.

More specifically, the etching paste 210 may be applied to be spaced apart from the edge of the second conductive region 120A positioned on the other surface 110S2 of the semiconductor substrate 110A.

Here, a material, position, thickness, width, and coating pattern of the applied etching paste 210 may be the same as those described above in the first embodiment of FIGS. 25 to 35.

Thus, the etching paste 210 may be applied at a distance of 2 mm or less from the edge of the second conductive region 120A.

Thereafter, the depth H200 of the isolation line 200 etched by the etching step S62 may be etched to 2 um to 5 um in a range larger than the thickness T120A of the second conductive region 120A. More specifically, the isolation line 200 may be formed to a depth of 3 um to 4 um in a range larger than the thickness T120A of the second conductive region 120A. Therefore, not only a portion of the second conductive region 120A but also a portion of the base region 10A of the semiconductor substrate 110A may be etched by the etching step S62.

Accordingly, a portion of the second conductive region 120A may be etched in the etching step S62 to expose the base region 10A of the semiconductor substrate 110A.

Therefore, when the isolation line 200 is positioned on the other surface 110S2 of the semiconductor substrate 110A, the base region 10A of the semiconductor substrate 110A exposed in the etching step S62 may be covered by the second passivation layer 130A in the passivation layer deposition step S17, and thus, the second passivation layer 130A may be in contact with the base region 10A of the semiconductor substrate 110A through the second conductive region 120A at the portion where the isolation line 200 is positioned.

Figure 39:
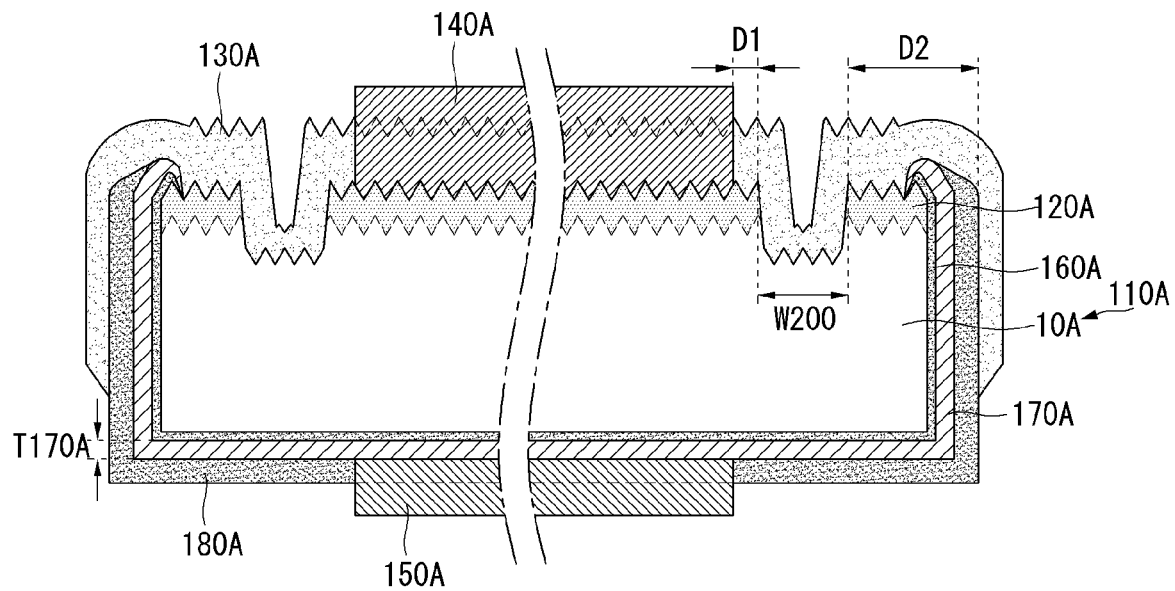

Thereafter, as illustrated in FIG. 39, the first electrode 150A connected to the first conductive region 170A through the first passivation layer 180A and the second electrode 140A connected to the second conductive region 120A through the second passivation layer 130A may be formed in the electrode forming step S18.

Accordingly, the solar cell described above with reference to (b) of FIG. 24 may be manufactured.

In the solar cell manufacturing method according to the first embodiment of FIGS. 25 to 35 and the modification of FIGS. 36 to 39, the example in which the isolation step S16 is performed after the heat treatment step S15 is performed is described, but the present disclosure is not limited thereto and the isolation step S16 may be performed before the heat treatment step S15. This will be described hereinafter.

FIGS. 40 to 43 are views illustrating a second embodiment of a solar cell manufacturing method for forming an isolation structure of a solar cell according to a second embodiment of the present disclosure.

Figure 40:
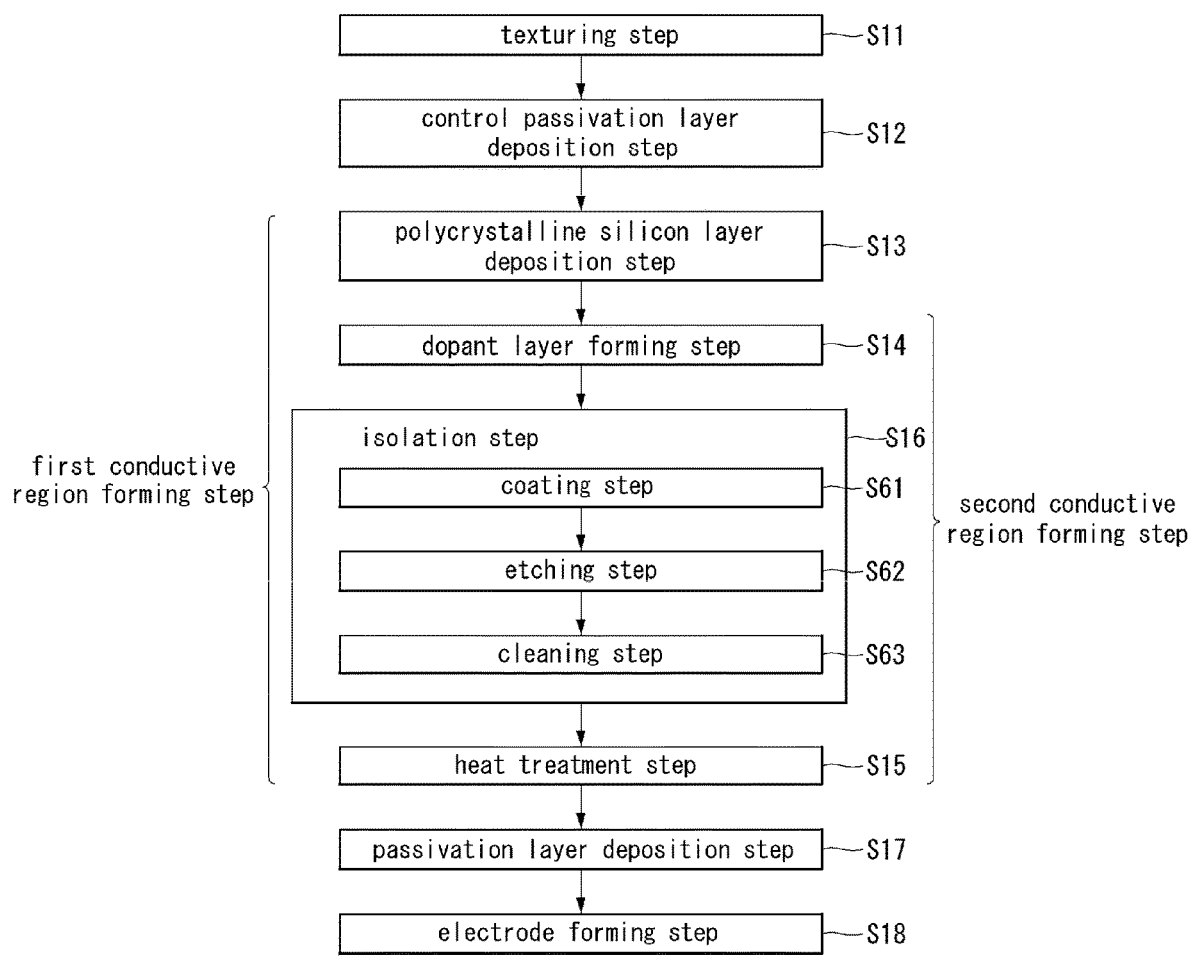
FIGS. 40 to 43 are views illustrating a second embodiment of a solar cell manufacturing method for forming an isolation structure of a solar cell according to the second embodiment of the present disclosure.

As illustrated in FIG. 40, the solar cell manufacturing method according to the present embodiment may include the texturing step S11, the control passivation layer deposition step S12, and the first conductive region 170A forming step S13/S15, the second conductive region 120A forming step S14/S15, the isolation step S16, the passivation layer deposition step S17, and the electrode forming step S18.

The first conductive region 170A forming step S13/S15 may include the polycrystalline silicon layer deposition step S13 and the heat treatment step S15. The second conductive region 120A forming step may include a dopant layer forming step S14 and the heat treatment step S15. The isolation step S16 may be performed between the first and second conductive region forming steps and include the coating step S61, the etching step S62 and the cleaning step S63.

The isolation step S6 may be performed between the polycrystalline silicon layer deposition step S13 and the heat treatment step S15 of the first conductive region 170A forming step and between the dopant layer forming step S14 and the heat treatment step S15 of the second conductive region 120A forming step.

Therefore, when the heat treatment step S15 of the first conductive region 170A forming step and the heat treatment step S15 of the second conductive region 120A forming step are performed at the same time, the isolation step S16 may be performed between the dopant layer forming step S14 and the heat treatment step S15.

Thus, when the dopant layer forming step S14 is performed after the polycrystalline silicon layer deposition step S13, the isolation step S16 may be performed before the heat treatment step S15 after the dopant layer forming step S14 as illustrated in FIG. 40.

In the solar cell manufacturing method according to the present embodiment, the texturing step S11, the control passivation layer deposition step S12, the polycrystalline silicon layer deposition step S13, and the dopant layer forming step S14 are the same as those of the solar cell manufacturing method according to the first embodiment of FIG. 25 described above, and thus, a detailed description thereof will be omitted.

In the solar cell manufacturing method according to the present embodiment, the coating step S61, the etching step S62, and the cleaning step S63 included in the isolation step S16 may be performed on one surface 110S1 of the semiconductor substrate between the dopant layer forming step S14 and the heat treatment step S15.

Figure 41:
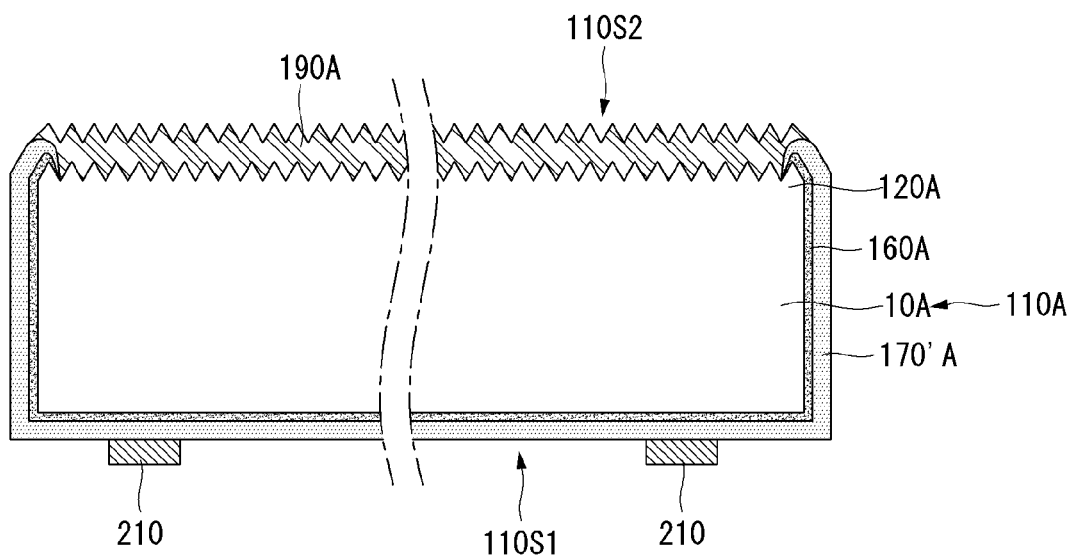

Therefore, after the dopant layer forming step S14, as illustrated in FIG. 41, in the coating step S61 of the isolation step S16, the etching paste 210 may be applied to be adjacent to the edge of the polycrystalline silicon layer 170'A deposited on one surface 110S1 of the semiconductor substrate 110A to form the first conductive region 170A.

In this case, a material, position, line pattern, line width, and thickness of the applied etching paste 210 may be the same as those described above in the embodiment of FIGS. 25 to 39.

Figure 42:
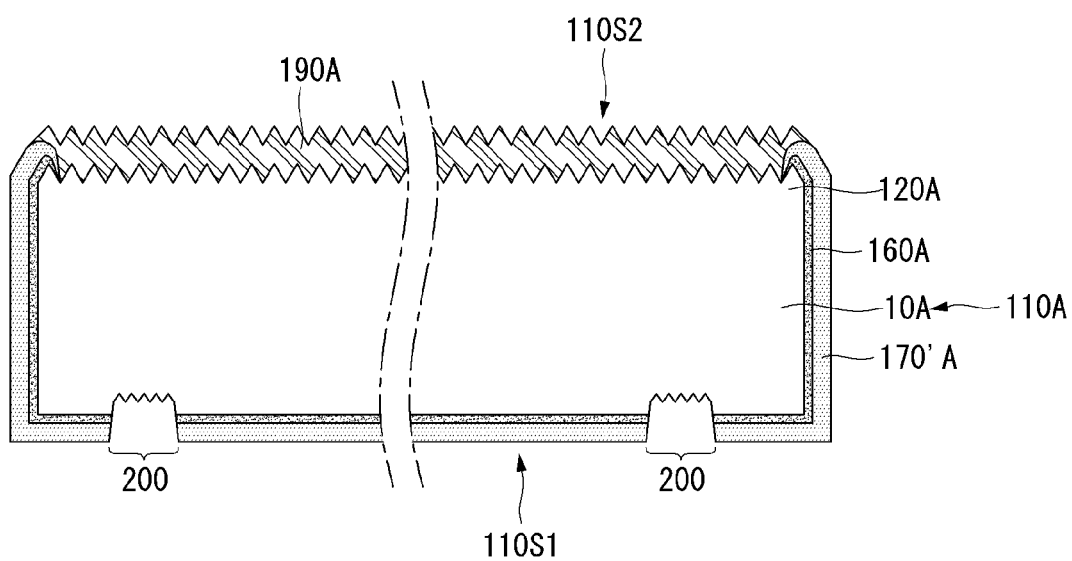
Figure 43:
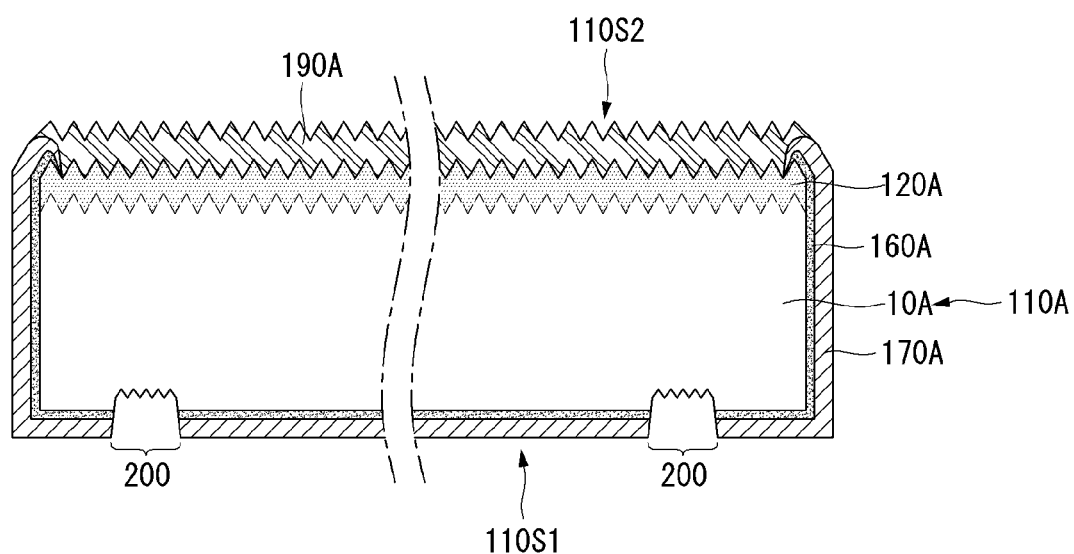

Thereafter, the etching step S62 may be performed, and as illustrated in FIG. 42, the etching step S62 and the cleaning step S63 may be performed.

Accordingly, as illustrated in FIG. 42, a portion of the polycrystalline silicon layer 170'A may be etched to expose the base region 10A of the semiconductor substrate 110A.

As described above, after the isolation step S16 is finished, the heat treatment step S15 may be performed so that the first conductivity type dopant contained in the polycrystalline silicon layer 170'A positioned on one surface 110S1 of the semiconductor substrate 110A may be activated to allow the polycrystalline silicon layer 170'A to be formed as the first conductive region 170A and the second conductivity type dopant contained in the dopant layer 190A may be diffused into the other surface 110S2 of the semiconductor substrate 110A to form the second conductive region 120A at a portion of the base region 10A of the semiconductor substrate 110A.

In the present embodiment, since the isolation step S16 is performed before the heat treatment step S15, the first conductive region 170A and the second conductive region 120A may be electrically isolated from each other even after the heat treatment step S15.

After the heat treatment step S15, as illustrated in FIG. 40, the passivation layer deposition step S17 and the electrode forming step S18 may be performed to manufacture the solar cell according to the embodiment of the present disclosure.

Accordingly, since the first passivation layer 180A is deposited on the first conductive region 170A where the isolation line 200 is formed, the first passivation layer 180A may be in contact with the base region 10A of the semiconductor substrate 110A through the first conductive region 170A at the portion where the isolation line is positioned, and the first passivation layer 180A may be in contact with the first conductive region 170A at the portion where the isolation line 200 is not positioned.

In addition, the second passivation layer 130A may be in contact with the second conductive region 120A on one surface 110S1 of the semiconductor substrate 110A.

In addition, in the solar cell manufacturing method according to the present embodiment, the isolation step S16 may be performed on the other surface 110S2 of the semiconductor substrate 110A. This will be described in more detail as follows.

Figure 44:
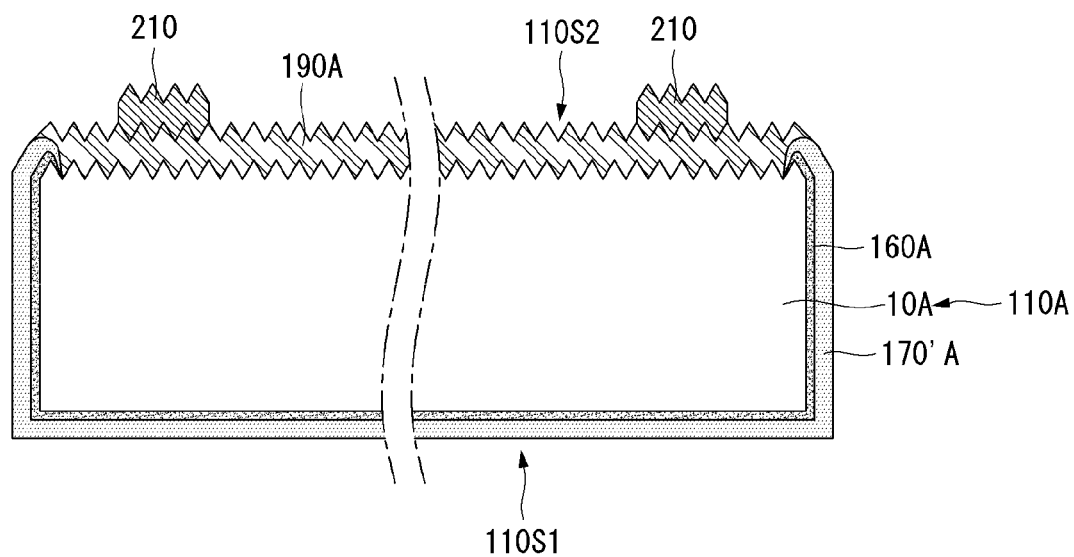
FIGS. 44 to 46 are views illustrating a modification of the second embodiment illustrated in FIGS. 40 to 43.
Figure 45:
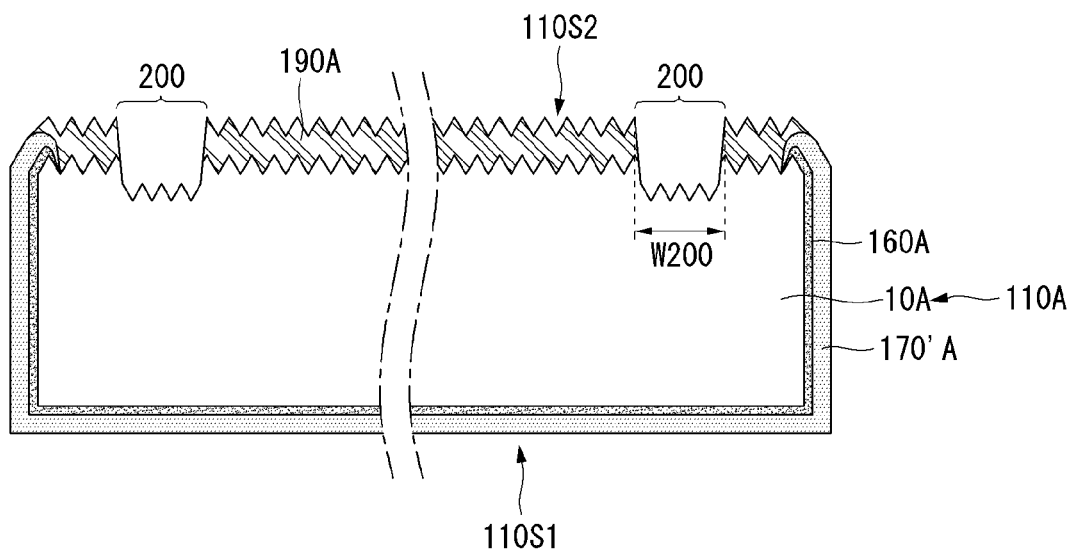
Figure 46:
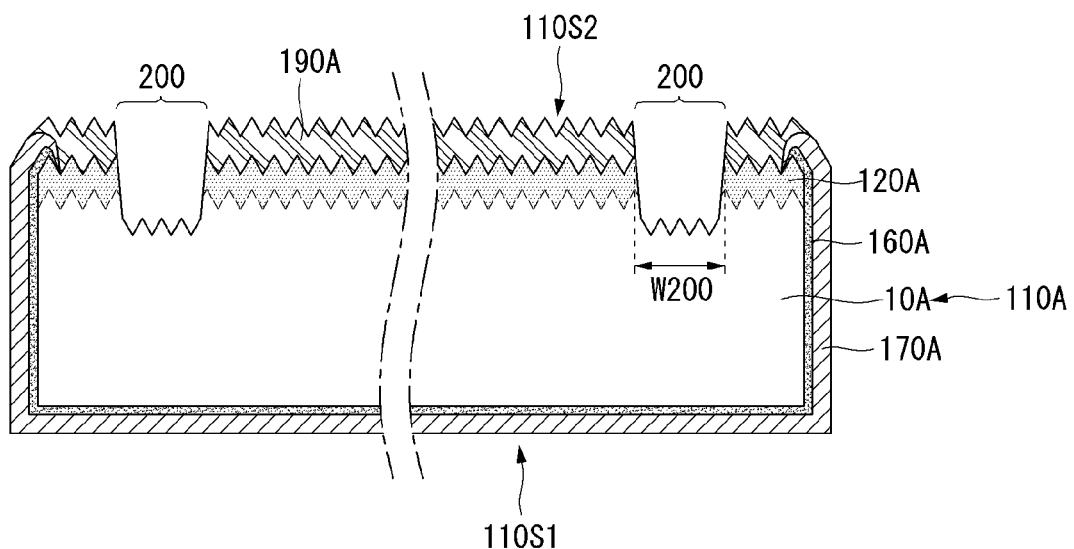

FIGS. 44 to 46 are views illustrating a modification of the second embodiment illustrated in FIGS. 40 to 43.

The solar cell manufacturing method according to the present modification may be the same in process configuration and order as those of the solar cell manufacturing method illustrated in FIG. 40 described above and may include the texturing step S11, the control passivation layer deposition step S12, the first conductive region 170A forming step S13/S15, the second conductive region 120A forming step S14/S15, the isolation step S16, the passivation layer deposition step S17, and the electrode forming step S18.

The first conductive region 170A forming step S13/S15 may include the polycrystalline silicon layer deposition step S13 and the heat treatment step S15, and the second conductive region 120A forming step S14/S15 may include the dopant layer forming step S4 and the heat treatment step S5, and the isolation step S6 may include the coating step S61, the etching step S62, and the cleaning step S63.

Therefore, hereinafter, descriptions of the same process configuration and order as those of the second embodiment illustrated in FIG. 40 will be omitted, and different parts will be mainly described.

In the solar cell manufacturing method according to the present modification, the isolation step S16 including the coating step S61, the etching step S62, and the cleaning step S63 may be performed on the other surface 110S2 of the semiconductor substrate 110 between the dopant layer forming step S14 and the heat treatment step S15.

Therefore, after the dopant layer forming step S14 illustrated in FIG. 40, as illustrated in FIG. 44, the etching paste 210 may be to be adjacent to the edge of the other surface 100S2 of the semiconductor substrate 110A in the coating step S61 of the isolation step S16.

More specifically, the etching paste 210 may be applied to be spaced apart from the edge of the dopant layer 190A positioned on the other surface 110S2 of the semiconductor substrate 110A.

Here, a material, position, thickness, width, and coating pattern of the applied etching paste 210 may be the same as those described above in the previous embodiment.

Thus, the etching paste 210 may be applied at a distance of 2 mm or less from the edge of the dopant layer 190A.

Next, as illustrated in FIG. 46, by the etching step S62, the depth H200 of the etched isolation line 200 may be etched to be 2 um to 5 um in a range larger than the sum of the thicknesses of the dopant layer 190A and the second conductive region 120A formed by the dopant layer 190A, and more specifically, the isolation line 200 may be formed to have a depth of 3 um to 4 um in a range larger than the sum of the thicknesses of the dopant layer 190A and the second conductive region 120A formed by the dopant layer 190A.

Accordingly, not only a portion of the dopant layer 190A but also a portion of the base region 10A of the semiconductor substrate 110A may be etched by the etching step S62.

Accordingly, a portion of the dopant layer 190A may be etched in the etching operation S62 to expose the base region 10A of the semiconductor substrate 110A.

Thereafter, the heat treatment step S15 may be performed at 800° C. to 1000° C. so that the first conductivity type dopant contained in the polycrystalline silicon layer 170'A may be activated to allow the polycrystalline silicon layer 170'A to be formed as the first conductive region 170A and the second conductivity type dopant contained in the dopant layer 190A may be diffused with a thickness smaller than the depth H200 of the isolation line 200 into the other surface 110S2 of the semiconductor substrate 110A to form the second conductive region 120A at a portion of the base region 10A of the semiconductor substrate 110A as shown in FIG. 46.

For example, a thickness of the first conductive region 170A may be 300 nm to 400 nm, and a thickness of the second conductive region 120A may be 1.5 um to 2.5 um in a thickness range thinner than the depth H200 of the isolation line 200.

Thereafter, as illustrated in FIG. 40, the passivation layer deposition step S17 and the electrode forming step S18 may be performed. The passivation layer deposition step S17 and the electrode forming step S18 may be the same as those described above in the solar cell manufacturing method according to the embodiment of FIG. 40 described above.

Accordingly, when the isolation line 200 is positioned on the other surface 110S2 of the semiconductor substrate 110A, the base region 10A of the semiconductor substrate 110A exposed in the etching step S62 may be covered by the second passivation layer 130A in the passivation layer deposition step S17, and thus, the second passivation layer 130A may be in contact with the base region 10A of the semiconductor substrate 110A through the second conductive region 120A at the portion where the isolation line 200 is positioned.

In addition, the first passivation layer 180A may be formed to be in contact with the first conductive region 170A on one surface 110S1 of the semiconductor substrate 110A.

In addition, in the solar cell manufacturing method according to the present embodiment, the isolation step S16 may be performed between the polycrystalline silicon layer deposition step S13 and the dopant layer forming step S14.

For example, when the dopant layer forming step S14 is performed after the polycrystalline silicon layer deposition step S13 or when the polycrystalline silicon layer deposition step S13 is performed after the dopant layer forming step S14, the isolation step S16 may be performed between the polycrystalline silicon layer deposition step S13 and the dopant layer forming step S14.

Hereinafter, a case where the isolation step S16 is performed between the polycrystalline silicon layer deposition step S13 and the dopant layer forming step S14 when the dopant layer forming step S14 is performed after the polycrystalline silicon layer deposition step S13 will be described.

FIGS. 47 to 51 are views illustrating a third embodiment of a solar cell manufacturing method for forming an isolation structure of a solar cell according to the second embodiment of the present disclosure.

Figure 47:
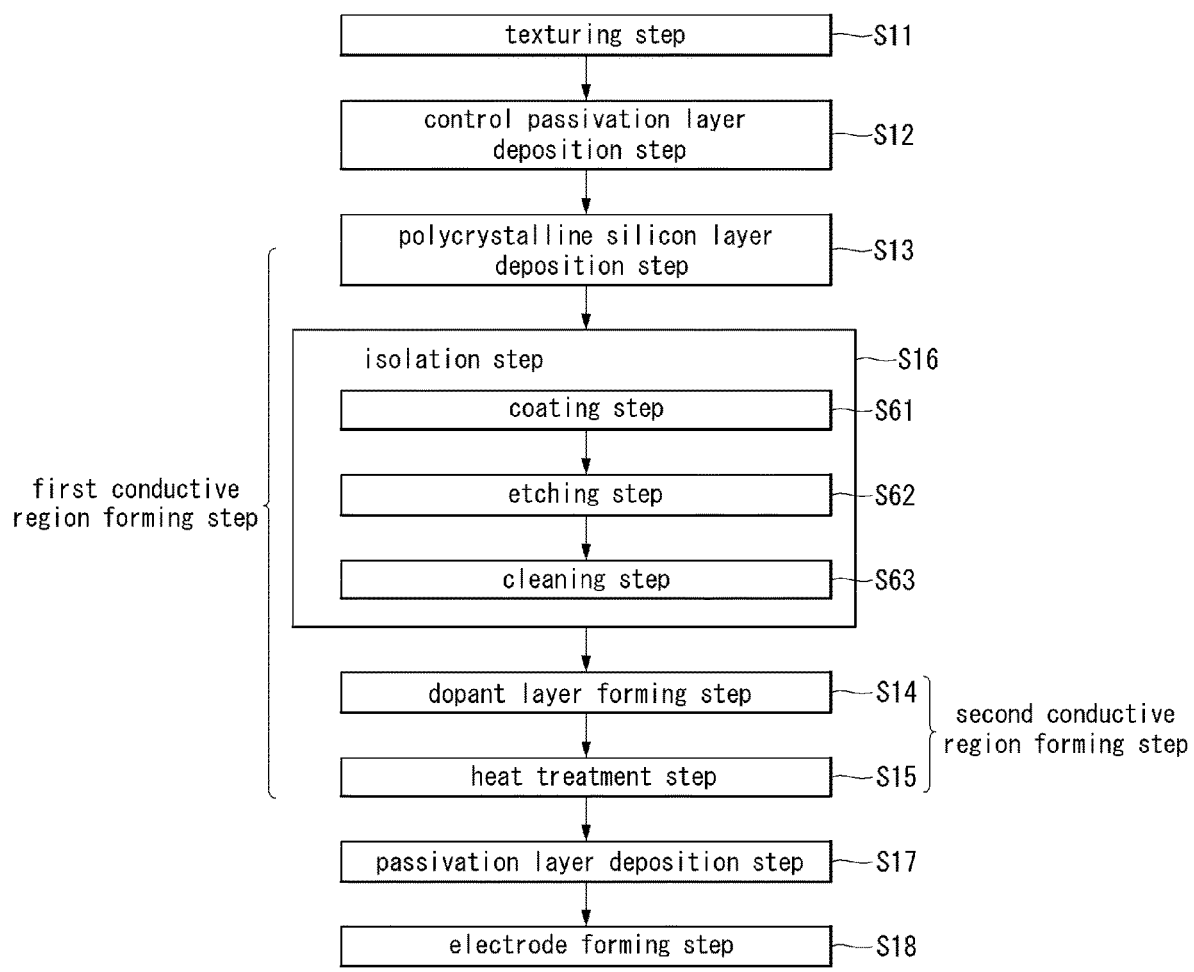
FIGS. 47 to 51 are views illustrating a third embodiment of a solar cell manufacturing method for forming an isolation structure of a solar cell according to the second embodiment of the present disclosure.

As illustrated in FIG. 47, the solar cell manufacturing method according to the present embodiment may include the texturing step S11, the control passivation layer deposition step S12, and the first conductive region 170A forming step S13/S15, the isolation step S16, the second conductive region 120A forming step S14/S15, the passivation layer deposition step S17, and the electrode forming step S18.

The first conductive region 170A forming step S13/S15 may include the polycrystalline silicon layer deposition step S13 and the heat treatment step S15, and the second conductive region 120A forming step S14/S15 may include the dopant layer forming step S14 and the heat treatment step S15. The isolation step S16 may include the coating step S61, the etching step S62, and the cleaning step S63. The isolation step S16 may be performed in the middle of performing the first conductive region 170A forming step.

Therefore, as illustrated in FIG. 47, when the dopant layer forming step S14 is performed after the polycrystalline silicon layer deposition step S13, the isolation step S16 may be performed between the polycrystalline silicon layer deposition step S13 and the dopant layer forming step S14.

In the solar cell manufacturing method according to the present embodiment, the texturing step S11, the control passivation layer deposition step S12, and the polycrystalline silicon layer deposition step S13 are the same as those of the solar cell manufacturing method according to the embodiment described above, and thus, a detailed description thereof will be omitted.

In the solar cell manufacturing method according to the present embodiment, the coating step S61, the etching step S62, and the cleaning step S63 included in the isolation step S16 may be performed on one surface 110S1 of the semiconductor substrate 110 between the polycrystalline silicon layer deposition step S13 and the dopant layer forming step S4.

Figure 48:
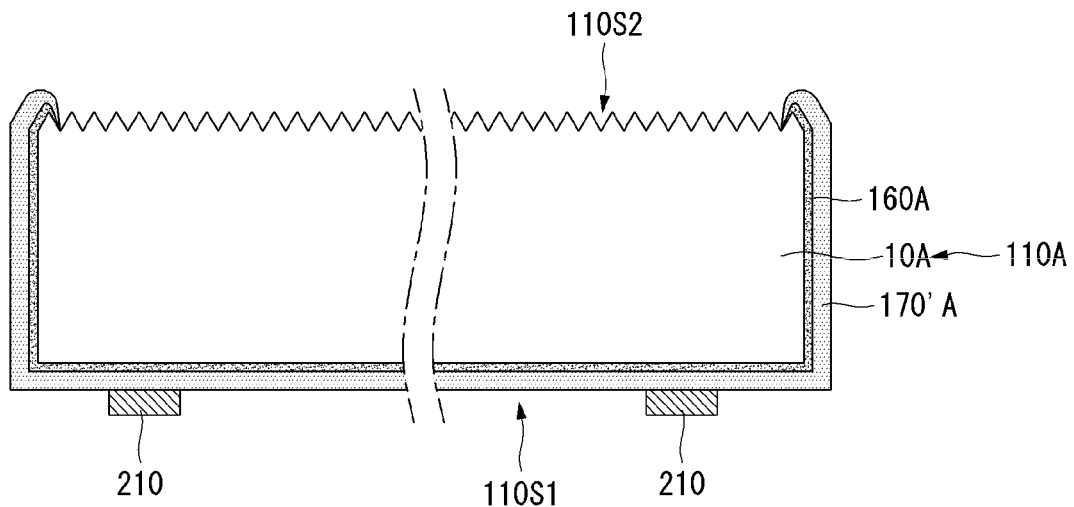

Therefore, after the polycrystalline silicon layer deposition step S13, as illustrated in FIG. 48, in the coating step S61 of the isolation step S16, the etching paste 210 may be applied to be adjacent to the edge of the polycrystalline silicon layer 170'A deposited on one surface 110S1 of the semiconductor substrate 110A to form the first conductive region 170A.

Here, a material, position, line pattern, line width, and thickness of the applied etching paste 210 may be the same as those described above in the previous embodiment.

Figure 49:
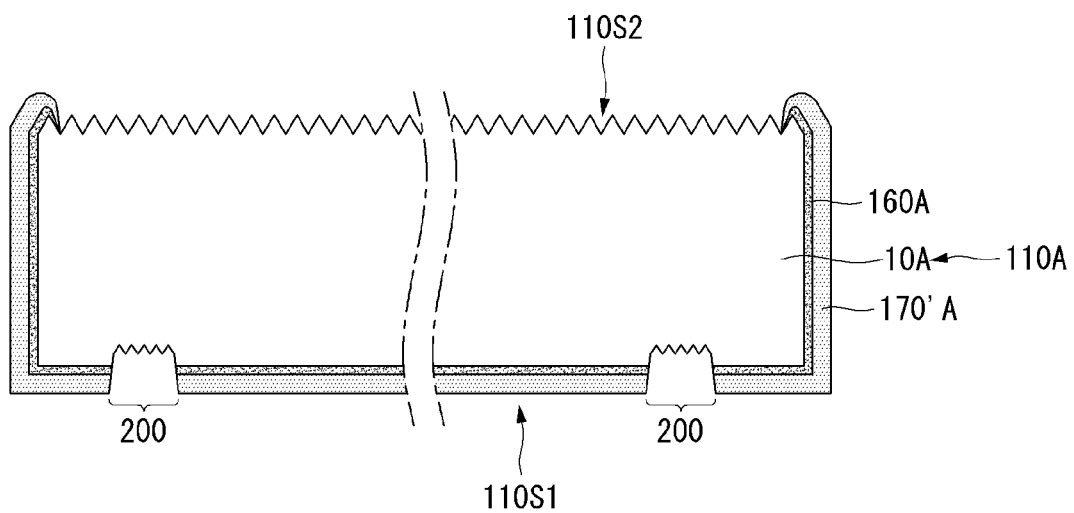

Thereafter, the etching step S62 may be performed, and as illustrated in FIG. 49, the etching step S62 and the cleaning step S63 may be performed.

Accordingly, as illustrated in FIG. 49, a portion of the polycrystalline silicon layer 170'A may be etched to expose the base region 10A of the semiconductor substrate 110A.

Figure 50:
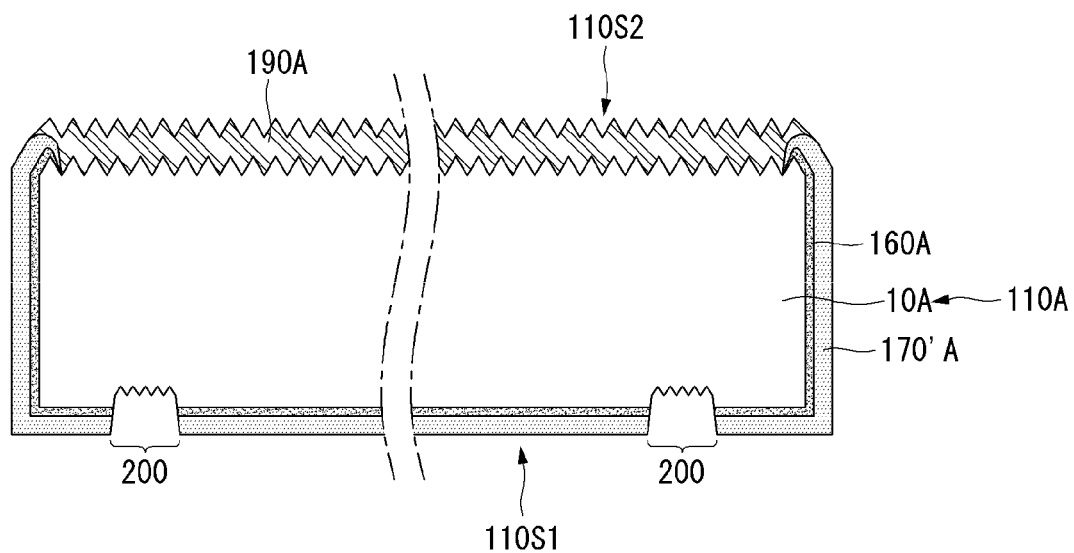

As described above, after the isolation step S16 is completed, as illustrated in FIG. 50, the dopant layer forming step S14 of forming the dopant layer 190A on the other surface 110S2 of the semiconductor substrate 110A may be performed.

Figure 51:
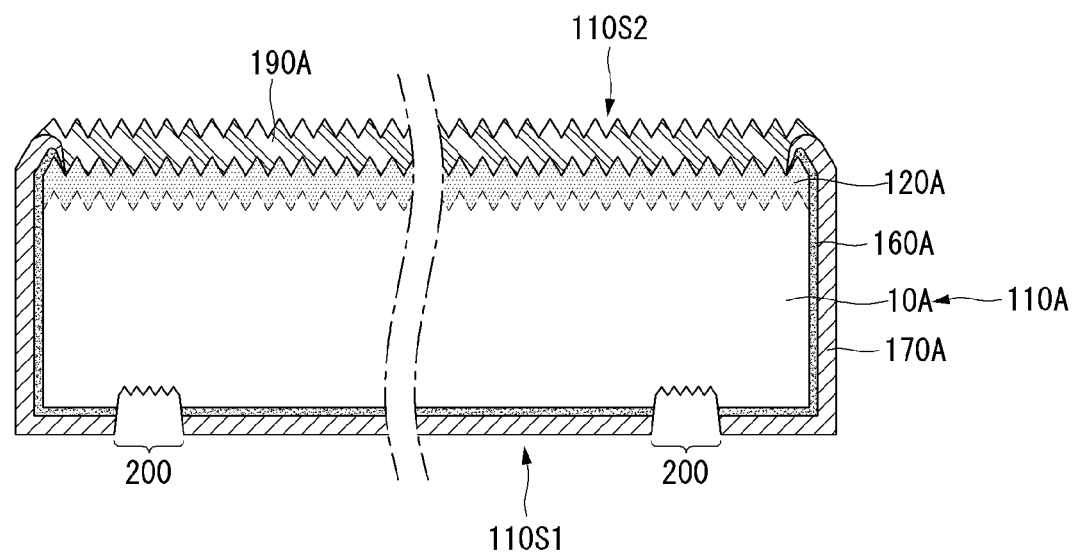

Thereafter, as illustrated in FIG. 51, the heat treatment step S15 may be performed so that the first conductivity type dopant contained in the polycrystalline silicon layer 170'A positioned on one surface 110S1 of the semiconductor substrate 110A may be activated to allow the polycrystalline silicon layer 170'A to be formed as the first conductive region 170A, and the second conductivity type dopant contained in the dopant layer 190A may be diffused into the other surface 110S2 of the semiconductor substrate 110A to form the second conductive region 120A at a portion of the base region 10A of the semiconductor substrate 110A.

According to the present embodiment, since the isolation step S16 is first performed between the polycrystalline silicon layer deposition step S13 and the heat treatment step S15, the first conductive region 170A and the second conductive region 120A may be electrically isolated from each other even after the heat treatment step S15.

After the heat treatment step S15, as illustrated in FIG. 47, the passivation layer deposition step S17 and the electrode forming step S18 may be performed to manufacture the solar cell.

Accordingly, since the first passivation layer 180A is deposited on the first conductive region 170A where the isolation line 200 is formed, the first passivation layer 180A may be in contact with the base region 10A of the semiconductor substrate 110A through the first conductive region 170A at the portion where the isolation line 200 is positioned and the first passivation layer 180A may be in contact with the first conductive region 170A at the portion where the isolation line 200A is not positioned.

In addition, the second passivation layer 130A may be formed to be in contact with the second conductive region 120A on one surface 110S1 of the semiconductor substrate 110A.

As described above, in the solar cell manufacturing method according to the present disclosure, since the isolation line 200 is formed by applying the etching paste 210 to the edge of one surface 110S1 or the other surface of the semiconductor substrate 110A to etch the element below the etching paste, contamination of the semiconductor equipment may be minimized, and since the etching paste 210 is uniformly applied to each solar cell, a defective rate of the edge isolation structure may be minimized.

In addition, in the solar cell and the manufacturing method thereof according to the embodiment of the present disclosure, since the edge isolation structure is formed by applying the etching paste 210 to perform etching, the manufacturing process may be simplified.

What is claimed is:

1. A method of manufacturing a solar cell, the method comprising:

a polycrystalline silicon layer forming operation of forming a polycrystalline silicon layer containing a first dopant on a back surface, on side surfaces and at edge portions of the front surface of a semiconductor substrate formed of a single crystal silicon material including a base region;

a front surface texturing operation of texturing a front surface of the semiconductor substrate and simultaneously removing the polycrystalline silicon layer formed at a first portion of the side surfaces of the semiconductor substrate and the edge portions of the front surface of the semiconductor substrate;

a second conductive region forming operation of diffusing a second dopant on the front surface of the semiconductor substrate to form a second conductive region;

a passivation layer forming operation of forming a first passivation layer on the polycrystalline silicon layer formed on the back surface of the semiconductor substrate and forming a second passivation layer on the second conductive region on the front surface of the semiconductor substrate; and an electrode forming operation of forming a first electrode connected to the polycrystalline silicon layer through the first passivation layer and forming a second electrode at the second conductive region through the second passivation layer, wherein in the front surface texturing operation, the polycrystalline silicon layer remains in a second portion of the side surfaces of the semiconductor substrate excluding the first portion.

2. The method of claim 1, wherein
the second conductive region forming operation comprises:
a dopant layer forming operation of forming a dopant layer having a second dopant on the front surface of the semiconductor substrate; and
a heat treatment operation of heat-treating the semiconductor substrate to diffuse the second dopant of the dopant layer to the front surface of the semiconductor substrate.

3. The method of claim 1, further comprising:
forming a control passivation layer on the entire surface of the semiconductor substrate, before the forming of the polycrystalline silicon layer.

4. The method of claim 3, wherein
the control passivation layer and the polycrystalline silicon layer formed on the front surface of the semiconductor substrate are simultaneously removed in the front surface texturing operation.

5. The method of claim 1, wherein
the front surface texturing operation is performed through wet etching.

6. The method of claim 5, wherein
in the wet etching, in a state where the front surface of the semiconductor substrate is in contact with a roller partially immersed in a texturing etching solution, when the roller rotates, the texturing etching solution present on the surface of the roller etches the front surface of the semiconductor substrate to form textured depressions and protrusions on the front surface of the semiconductor substrate.

7. The method of claim 2, wherein
in the heat treatment operation,
the first dopant is activated to cause the polycrystalline silicon layer to be formed as a first conductive region, and
the second dopant is diffused and activated on the front surface of the semiconductor substrate to form the second conductive region on the front surface of the semiconductor substrate.

8. The method of claim 1, further comprising:
a mask forming operation of forming a mask layer for preventing texturing etching, on the polycrystalline silicon layer of the back surface of the semiconductor substrate, between the polycrystalline silicon layer forming operation and the front surface texturing operation.

9. The method of claim 8, wherein
the mask forming operation comprises:
forming the mask layer on the entire surface of the polycrystalline silicon layer and on the entire front surface of the semiconductor substrate; and
removing a portion of the mask layer other than a portion thereof formed on the polycrystalline silicon layer positioned on the back surface of the semiconductor substrate.

10. The method of claim 9, wherein
the front surface texturing operation is performed in a state where the mask layer is formed on the back surface of the semiconductor substrate, and
in a state where the front surface of the semiconductor substrate with the mask layer formed thereon is in contact with a roller partially immersed in a texturing etching solution, when the roller rotates, the texturing etching solution present on the roller etches the front surface of the semiconductor substrate to form textured depressions and protrusions on the front surface of the semiconductor substrate or
the semiconductor substrate having the mask layer is immersed in the texturing etching solution filled in a bath to form the textured depressions and protrusions on the front surface of the semiconductor substrate.

11. The method of claim 1, wherein
in the front surface texturing operation, the polycrystalline silicon layer remains on the entire back surface of the semiconductor substrate.

* * * * *